(12) United States Patent
Bleck et al.

(10) Patent No.: US 6,733,649 B2
(45) Date of Patent: May 11, 2004

(54) ELECTROCHEMICAL PROCESSING METHOD

(75) Inventors: Martin Bleck, Kalispell, MT (US); Kenneth C. Haugan, Kalispell, MT (US); Larry R. Radloff, Kalispell, MT (US); Harry Geyer, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/811,261

(22) Filed: Mar. 16, 2001

(65) Prior Publication Data

US 2002/0050452 A1 May 2, 2002

Related U.S. Application Data

(63) Continuation of application No. 09/300,610, filed on Apr. 27, 1999, now Pat. No. 6,274,013, which is a continuation of application No. 08/680,057, filed on Jul. 15, 1996, now Pat. No. 5,980,706.

(51) Int. Cl.$^7$ ................................................. C25D 5/00
(52) U.S. Cl. .......................... 205/80; 205/96; 205/118; 205/123; 205/157; 205/640; 205/687; 205/775
(58) Field of Search ...................... 204/297.08, 297.09, 204/297.1, 297.14, 224 R; 205/123, 143, 157, 80, 96, 118, 640, 687, 775; 118/728, 729, 730, 500, 503; 156/345 WH; 269/24, 27

(56) References Cited

U.S. PATENT DOCUMENTS

| | | |
|---|---|---|
| 3,948,502 A | 4/1976 | Waller et al. |
| 4,192,729 A | 3/1980 | Cancelleri et al. |
| 5,013,015 A | 5/1991 | Fatheree |

(List continued on next page.)

FOREIGN PATENT DOCUMENTS

| | | |
|---|---|---|
| WO | WO 95/06326 | 3/1995 |
| WO | WO 98/02909 | 7/1997 |

OTHER PUBLICATIONS

American Heritage Dictionary, Houghton Mifflin Co. Boston, pp 824, 1976.*
U.S. patent application Ser. No. 09/882,293, Hanson et al., filed Jun. 15, 2001.
U.S. patent application Ser. No. 09/977,410, Graham et al., filed Oct. 15, 2001.
U.S. patent application Ser. No. 10/102,040, Bleck et al., filed Mar. 19, 2002.

*Primary Examiner*—Roy King
*Assistant Examiner*—W. T. Leader
(74) *Attorney, Agent, or Firm*—Perkins Coie LLP

(57) ABSTRACT

A semiconductor workpiece holder for use in processing a semiconductor workpiece includes a workpiece support operatively mounted to support a workpiece in position for processing. A finger assembly is operatively mounted upon the workpiece support and includes a finger tip. The finger assembly is movable between an engaged position in which the finger tip is engaged against the workpiece, and a disengaged position in which the finger tip is moved away from the workpiece. Preferably, at least one electrode forms part of the finger assembly and includes an electrode contact for contacting a surface of said workpiece. At least one protective sheath covers at least some of the electrode contact. According to one aspect of the invention, a sheathed electrode having a sheathed electrode tip is positioned against a semiconductor workpiece surface in a manner engaging the workpiece surface with said sheathed electrode tip. A seal is formed about the periphery of the electrode tip, and with the electrode tip engaging the workpiece, a desired electrical contact is made to the workpiece. Thereafter, the workpiece is exposed to desired semiconductor processing conditions.

9 Claims, 20 Drawing Sheets

U.S. PATENT DOCUMENTS

| | | |
|---|---|---|
| 5,078,852 A | 1/1992 | Yee et al. |
| 5,167,792 A | 12/1992 | Kamitakahara et al. |
| 5,168,886 A | 12/1992 | Thompson et al. |
| 5,168,887 A | 12/1992 | Thompson et al. |
| 5,232,511 A | 8/1993 | Bergman |
| 5,235,995 A | 8/1993 | Bergman et al. |
| 5,238,500 A | 8/1993 | Bergman |
| 5,332,445 A | 7/1994 | Bergman |
| 5,431,421 A | 7/1995 | Thompson et al. |
| 5,445,172 A | 8/1995 | Thompson et al. |
| 5,500,081 A | 3/1996 | Bergman |
| 5,522,975 A | 6/1996 | Andricacos et al. |
| 5,980,706 A * | 11/1999 | Bleck et al. ............ 204/297 R |
| 5,985,126 A | 11/1999 | Bleck et al. |
| 6,274,013 B1 * | 8/2001 | Bleck et al. ............ 204/297.08 |
| 6,358,388 B1 | 3/2002 | Bleck et al. |
| 6,461,494 B1 * | 10/2002 | Batz, Jr. et al. ............ 205/123 |

* cited by examiner

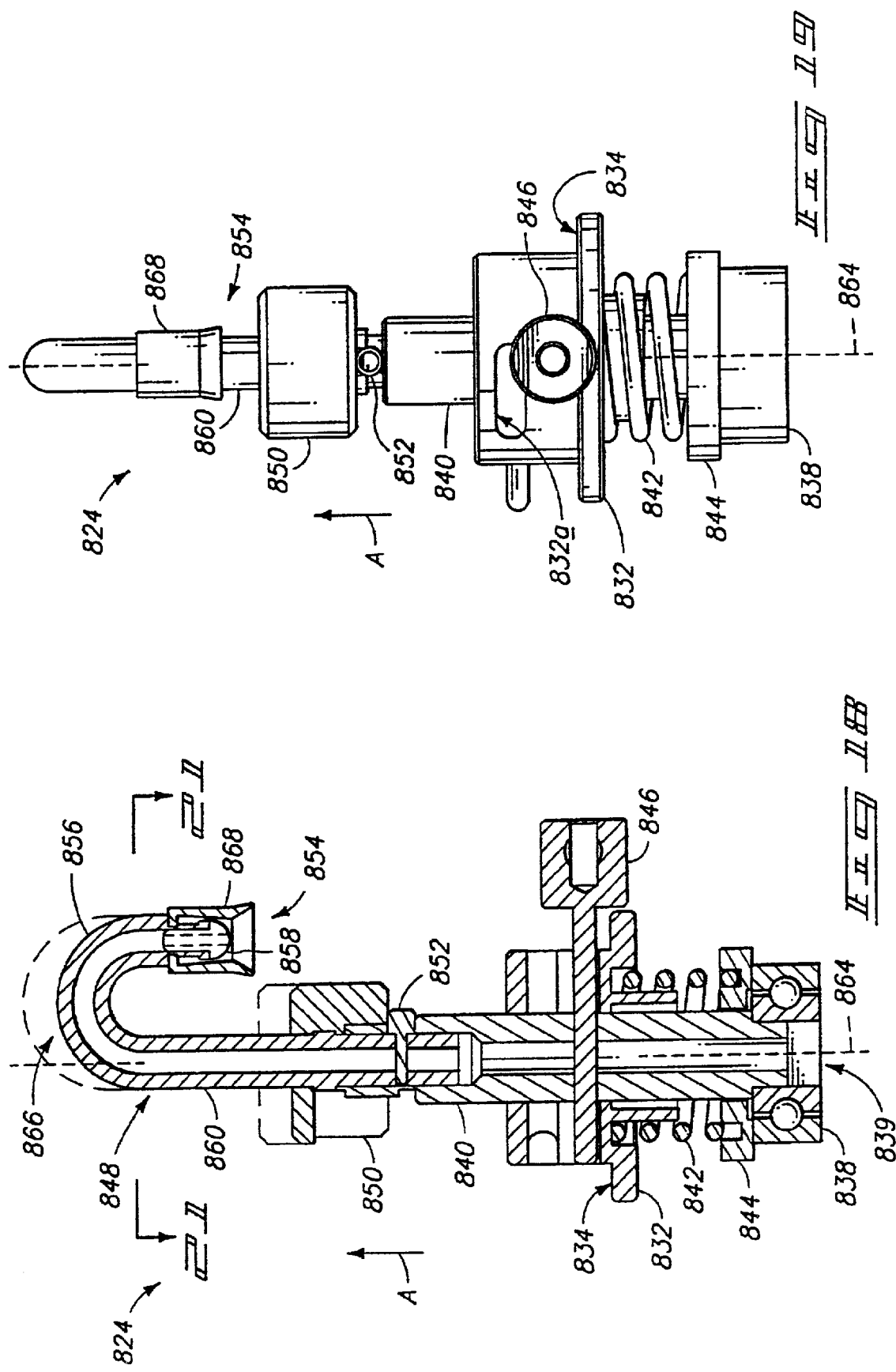

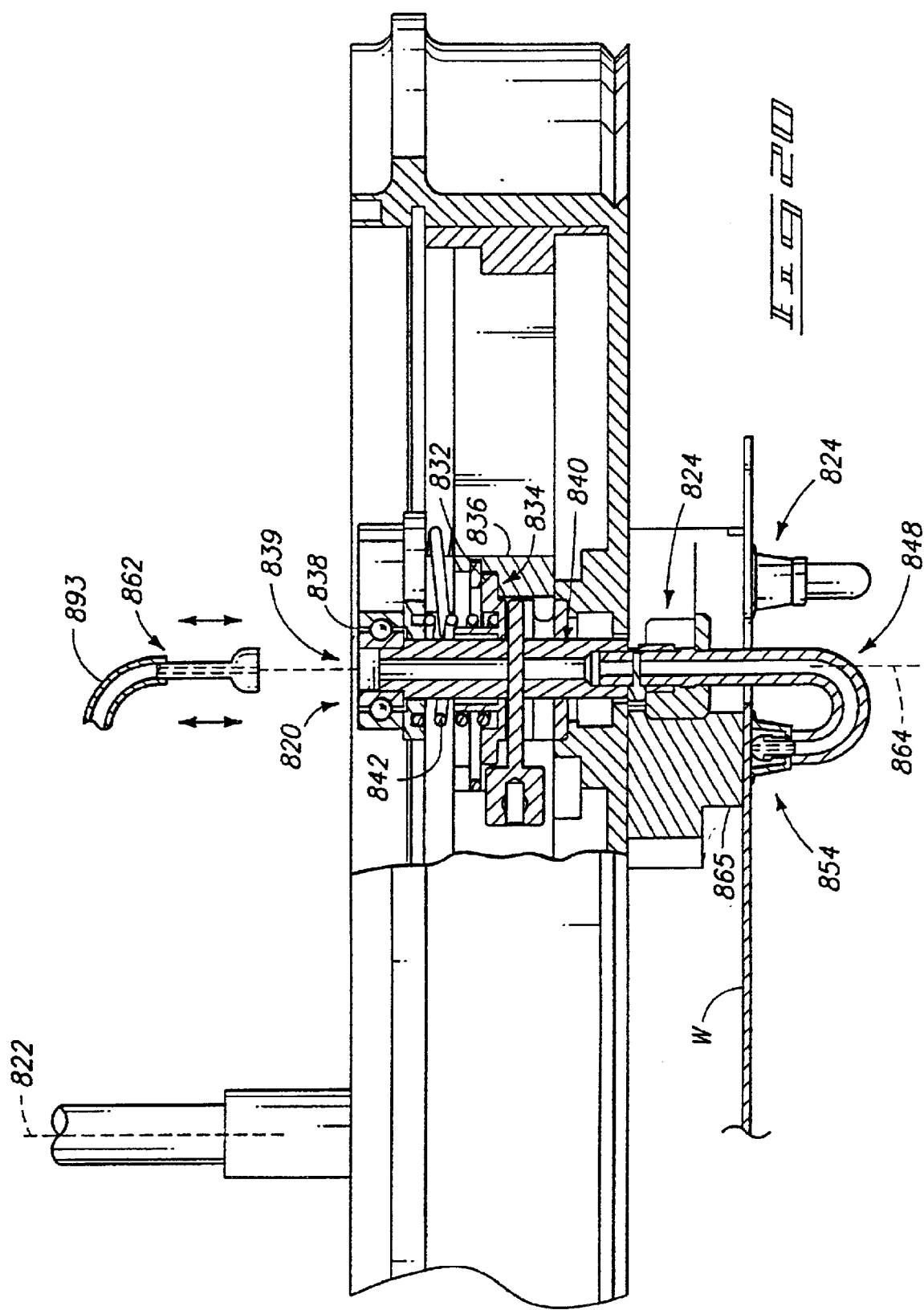

ELECTROCHEMICAL PROCESSING METHOD

This application is a continuation of U.S. Ser. No. 09/300,610, filed Apr. 27, 1999 now U.S. Pat. No. 6,274,013, which is a continuation of U.S. Ser. No. 08/680,057, filed Jul. 15, 1996 now U.S. Pat. No. 5,980,706.

TECHNICAL FIELD

This invention relates to semiconductor workpiece holders and methods for use in processing semiconductor workpieces.

BACKGROUND OF THE INVENTION

Semiconductor workpieces, such as semiconductor wafers and the like, are the subject of extensive processing which most often involves some type of automated or computer controlled processing. In processing semiconductor workpieces it is often desirable to minimize the amount of human contact to which a particular workpiece is exposed. Such reduces the chances of an inadvertent contamination which could render the workpiece useless.

Often times during processing, it is necessary to treat a particular workpiece or workpiece surface with chemicals, either gaseous or liquid. Such treatment allows for films or layers of material to be deposited or grown on a workpiece surface. One method of accomplishing this is to expose the particular workpiece to desired processing environments in which desired chemicals are present to form or grow such films or layers. Some processing regimes involve moving the workpiece within the processing environment to effectuate film or layer coverage. Other processing regimes involve forming layers on or over a workpiece utilizing various electroplating techniques.

The above-described processing scenarios pose, among other challenges, a two-fold challenge. First, a challenge exists to reduce the amount of human contact with a semiconductor workpiece which is undergoing processing. Second, during such processing, challenges exist relating to the treatment of semiconductor workpieces during the various processing stages. For example, in the above described processing context in which a workpiece is exposed to and moved within a processing environment, challenges exist which relate to transferring the workpiece into the environment, effectively holding or maintaining the workpiece within the environment during processing, and moving the workpiece out of the environment at the conclusion of a particular processing stage. With respect to the semiconductor processing steps which utilize electroplating techniques, challenges exist which relate to effectively holding or maintaining the workpiece in a processing environment while a desired electrical bias is imparted to the workpiece.

The prior electroplating semiconductor processing equipment has also suffered some difficulty in that providing electrical contact between the electrodes and wafers has frequently led to the buildup of plating material deposits at the point of contact. This deposits can be problematic in subsequent processing steps and lead to defects in the resulting integrated circuits or other devices being made. Thus improved electrode constructions are needed to address this deficiency.

This invention grew out of the need to provide improved semiconductor processing devices and methods which effectively and efficiently hold or maintain workpieces within particular processing environments, including processing environments in which electroplating of workpieces takes place.

BRIEF DESCRIPTION OF THE DRAWINGS

Preferred embodiments of the invention are described below with reference to the accompanying drawings, which are briefly described below.

FIG. 18 is an isolated side sectional view of a finger assembly constructed in accordance with a preferred aspect of the invention and which is configured for mounting upon the FIG. 17 rotor.

FIG. 19 is a side elevational view of the finger assembly of FIG. 18.

FIG. 20 is a fragmentary cross-sectional enlarged view of a finger assembly and associated rotor structure.

DETAILED DESCRIPTION OF THE PREFERRED EMBODIMENTS

Figure 1:
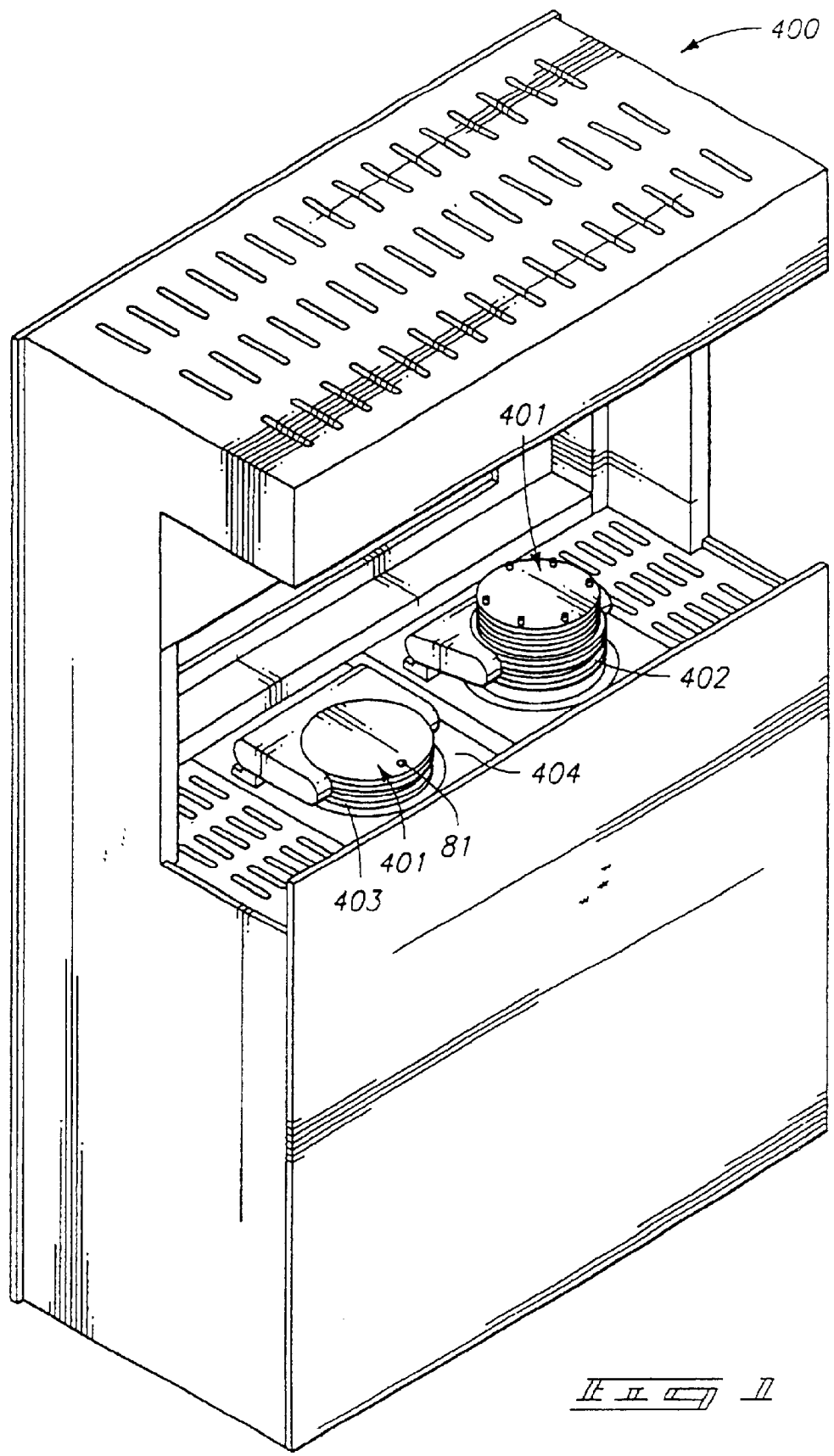
FIG. 1 is an environmental view of the semiconductor processing head of the present invention showing two processing heads in a processing station, one in a deployed, "closed" or "processing" position, and one in an "open" or "receive wafer" position.

This disclosure of the invention is submitted in furtherance of the constitutional purposes of the U.S. Patent Laws "to promote the progress of science and useful arts" (Article 1, Section 8).

TABLE 1

Listing of Subsections of Detailed Description and Pertinent Items with Reference Numerals and Page Numbers

| | |
|---|---|
| Workpiece Support | 8 |
| semiconductor processing machine 400 | 8 |
| workpiece supports 401 | 8 |
| Woripiece support 402 | 8 |
| Workpiece support 403 | 8 |
| semiconductor manufacturing chamber 404 | 8 |
| beam emitter 81 | 8 |
| operator base 405 | 8 |
| processing head 406 | 8 |
| operator arm 407 | 8 |
| wafer holder 408 | 8 |
| fingers 409 | 8 |
| Workpiece holder 408 | 8 |
| workpiece spin axis 410 | 8 |
| process pivot axis 411 | 8 |
| operator pivot axis 412 | 9 |
| workpiece W | 9 |
| fingertips 414 | 9 |
| | 9 |
| processing bowl 417 | 9 |
| left and right forks 418 and 419 | 10 |
| Operator Base | 11 |
| operator base back portion 420 | 11 |
| operator base left yoke arm 421 | 11 |
| operator base right yoke arm 422 | 11 |
| yoke arm fasteners 423 | 11 |
| operator arm bearings 424 | 11 |
| operator arm 425 | 11 |
| Operator Arm | 11 |
| process arm rear cavity 426 | 12 |
| lift motor 452 | 12 |
| rotate motor 428 | 12 |
| processing head left pivot shaft 429 | 12 |
| processing head right pivot shaft 430 | 12 |
| Operator Arm-Processing Head Rotate Mechanism | 12 |
| Processing head rotate mechanism 431 | 13 |
| rotate shaft 432 | 13 |
| securing collar 433 | 13 |
| rotate motor support 434 | 13 |
| rotate encoder 435 | 13 |
| rotate pulley inboard bearing 436 | 14 |
| rotate belt 437 | 14 |
| processing head pulley 438 | 14 |
| rotate belt tensioner 439 | 15 |
| tensioner hub 468 | 15 |
| processing head shaft bearing 440 | 15 |
| processing head rotate bearing 469 | 15 |
| processing head shaft bearing 441 | 15 |
| cable brackets 442 and 443 | 16 |
| rotate overtravel protect 444 | 16 |
| rotate flag 447 | 17 |
| Rotate optical switches 445 and 446 | 17 |
| Operator Arm-Lift Mechanism | 17 |
| operator arm lift mechanism 448 | 17 |
| lift motor shaft 454 | 18 |
| lift gear drive 453 | 18 |
| lift drive shaft 456 | 18 |

TABLE 1-continued

Listing of Subsections of Detailed Description and Pertinent Items with Reference Numerals and Page Numbers

| | |
|---|---|
| lift bushing 449 | 18 |
| anchor plate 458 | 18 |
| anchor fasteners 457 | 18 |
| | 18 |
| Lift bearing 450 | 18 |
| lift bearing support 460 | 19 |
| operator arm frame 461 | 19 |
| lift anchor 451 | 19 |
| lift overtravel protect 462 | 19 |
| lift optical switch low 463 | 20 |
| lift optical switch high 464 | 20 |
| lift flag 465 | 20 |
| lift motor encoder 455 | 20 |
| lift motor 452 | 20 |
| slotted lift flag mounting slots 467 | 20 |
| lift flag fasteners 466 | 20 |
| Processing Head | 21 |
| processing head housing 470 | 21 |
| circumferential grooves 471 | 21 |
| rotate shaft openings 474 and 475 | 21 |
| left and right processing head mounts 472 | 21 |
| processing head door 476 | 21 |
| processing head void 477 | 22 |
| Processing Head Spin Motor | 22 |
| workpiece holder 478 | 22 |
| spin axis 479 | 22 |
| spin motor 480 | 23 |
| top motor housing 481 | 23 |
| spin motor shaft 483 | 23 |
| workpiece holder rotor 484 | 23 |
| | 23 |
| rotor hub 485 | 23 |
| rotor hub recess 486 | 23 |
| workpiece shaft snap-ring 488 | 23 |
| rotor recess groove 489 | 23 |
| spin encoder 498 | 24 |
| optical tachometer 499 | 24 |
| Processing Head Finger Actuators | 26 |
| Pneumatic piston 502 | 27 |
| actuator spring 505 | 27 |
| cavity end cap 507 | 27 |
| retaining ring 508 | 27 |
| pneumatic inlet 503 | 27 |
| pneumatic supply line 504 | 27 |
| actuator plate 509 | 27 |
| actuator plate connect screw 510 | 27 |
| Wave springs 529 | 27 |
| bushing 512 | 27 |
| pneumatic piston recess 511 | 27 |
| finger actuator contacts 513 | 28 |
| Processing Head Workpiece Holder | 28 |
| finger actuator lever 514 | 28 |
| finger stem 515 | 29 |
| finger diaphragm 519 | 29 |
| workpiece holder rotor 484 | 29 |
| finger opening 521 | 29 |
| rotor diaphragm lip 523 | 29 |
| finger spring 520 | 29 |
| finger actuator tab 522 | 29 |
| finger collar or nut 517 | 29 |
| 518 | 29 |
| finger actuator mechanism 500 | 30 |
| cavity 501 | 30 |
| Semiconductor Workpiece Holder - Electroplating Embodiment | 30 |
| semiconductor workpiece holder 810 | 30 |
| bottom half or bowl 811 | 31 |
| Processing Head and Processing Head Operator | 31 |
| workpiece support 812 | 31 |
| spin head assembly 814 | 31 |
| lift/rotate assembly 816 | 31 |
| motor 818 | 32 |
| rotor 820 | 32 |
| rotor spin axis 822 | 32 |
| finger assembly 824 | 33 |
| actuator 825 | 33 |

TABLE 1-continued

Listing of Subsections of Detailed Description and
Pertinent Items with Reference Numerals and Page Numbers

| | |
|---|---|
| rotor center piece 826 | 33 |
| spokes 828 | 33 |
| rotor perimeter piece 830 | 33 |
| Finger Assembly | 34 |
| finger assembly frame 832 | 35 |
| angled slot 832a | 35 |
| finger assembly frame outer flange 834 | 35 |
| inner drive plate portion 836 | 35 |
| Finger Assembly Drive System | 35 |
| bearing 838 | 36 |
| collet 840 | 36 |
| bearing receptacle 839 | 36 |
| spring 842 | 36 |
| spring seat 844 | 36 |
| Finger Assembly Electrical System | 37 |
| pin connector 846 | 37 |
| finger 848 | 37 |
| nut 850 | 37 |
| anti-rotation pin 852 | 37 |
| finger tip 854 | 38 |
| electrode contact 858 | 38 |
| Finger Assembly Drive System Interface | 38 |
| finger actuator 862 | 38 |
| 863 | 39 |
| first movement path axis 864 | 39 |
| secondary linkage 865 | 39 |
| link arm 867 | 39 |
| actuator torque ring 869 | 39 |
| pneumatic operator 871 | 39 |
| Engaged and Disengaged Positions | 40 |
| arrow A | 41 |
| workpiece standoff 865 | 41 |
| bend 866 | 42 |
| Finger Assembly Seal | 42 |
| 868 | 42 |
| rim portion 870 | 42 |
| Methods and Operation | 44 |

Workpiece Support

Turning now to FIG. 1, a semiconductor processing machine 400 having two workpiece supports 401 is shown. Workpiece support 402 is shown in a "open" or "receive wafer" position in order to receive a workpiece or semiconductor wafer for further processing. Workpiece support 403 is shown in a "closed" or "deployed" position wherein the semiconductor wafer has been received by the workpiece support and is being exposed to the semiconductor manufacturing process in the semiconductor manufacturing chamber 404. FIG. 1 also shows an optional beam emitter 81 for emitting a laser beam detected by robotic wafer conveyors to indicate position of the unit.

Figure 2:
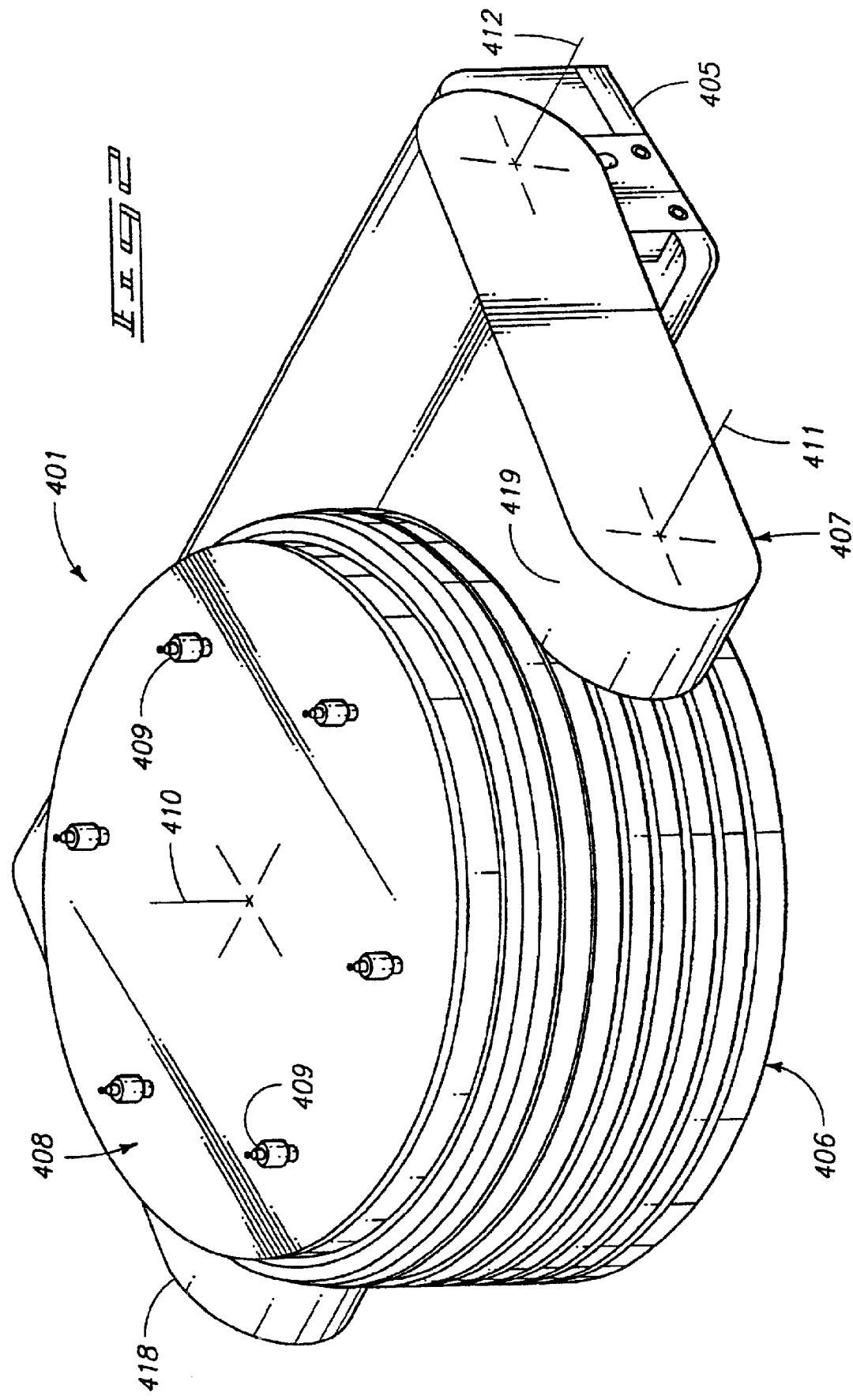
FIG. 2 is an isometric view of the semiconductor processing head of the present invention.

Turning now to FIG. 2, an enlarged view of the workpiece support 401 is shown. Workpiece support 401 advantageously includes operator base 405, a processing head 406, and an operator arm 407. Processing head 406 preferably includes workpiece holder or wafer holder 408 and which further includes fingers 409 for securely holding the workpiece during further process and manufacturing steps. Workpiece holder 408 more preferably spins about workpiece spin axis 410.

The processing head is advantageously rotatable about the processing head pivot axis or, more briefly termed, process pivot axis 411. In this manner, a workpiece (not shown) may be disposed between and grasped by the fingers 409, at which point the processing head is preferably rotated about process head pivot axis 411 to place the workpiece in a position to be exposed to the manufacturing process.

In the preferred embodiment, operator arm 407 may be pivoted about operator pivot axis 412. In this manner, the workpiece is advantageously lowered into the process bowl (not shown) to accomplish a step in the manufacture of the semiconductor wafer.

Figure 3:
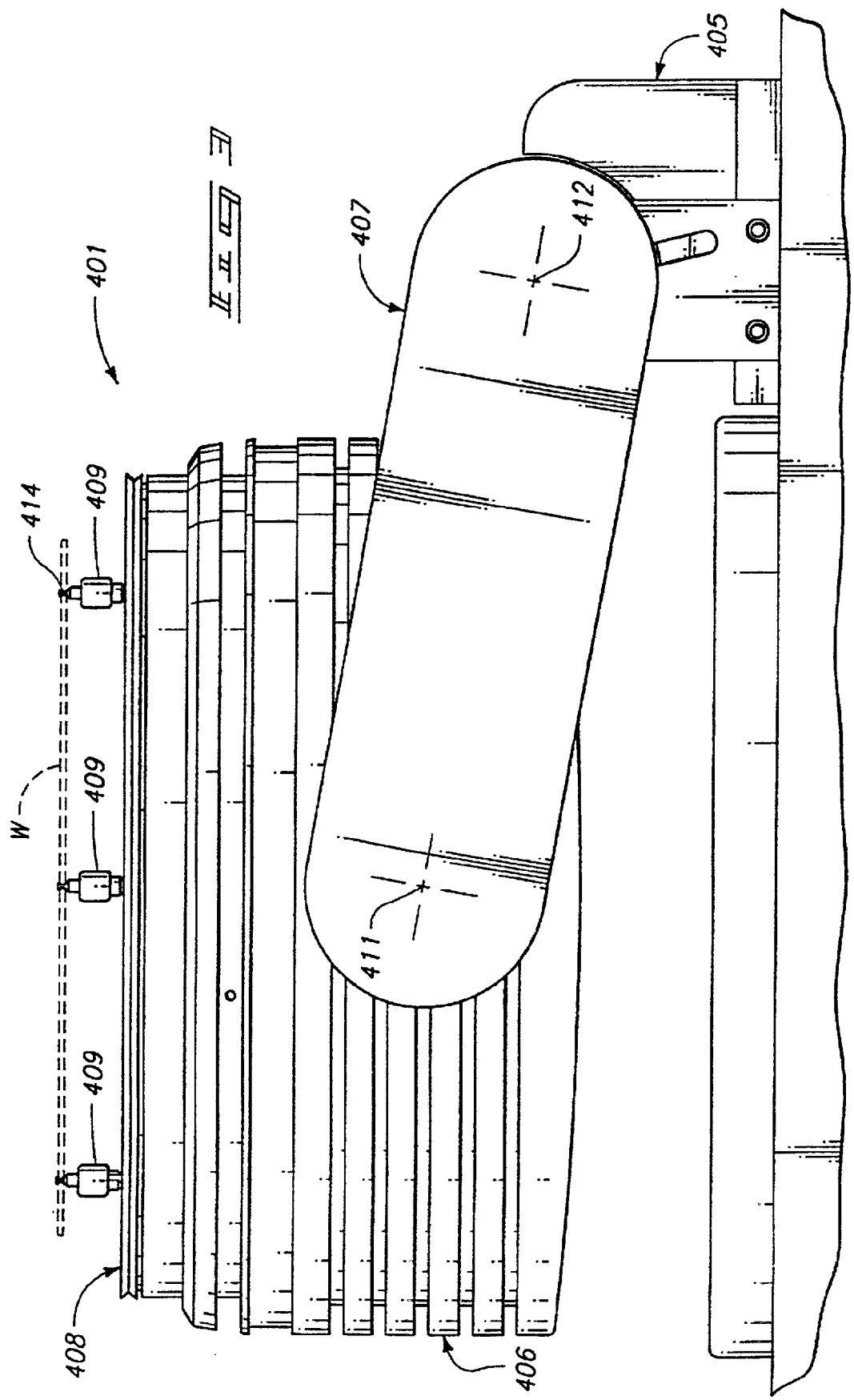
FIG. 3 is a side elevation view of the processing head of the present invention showing the head in a "receive wafer" position.
Figure 4:
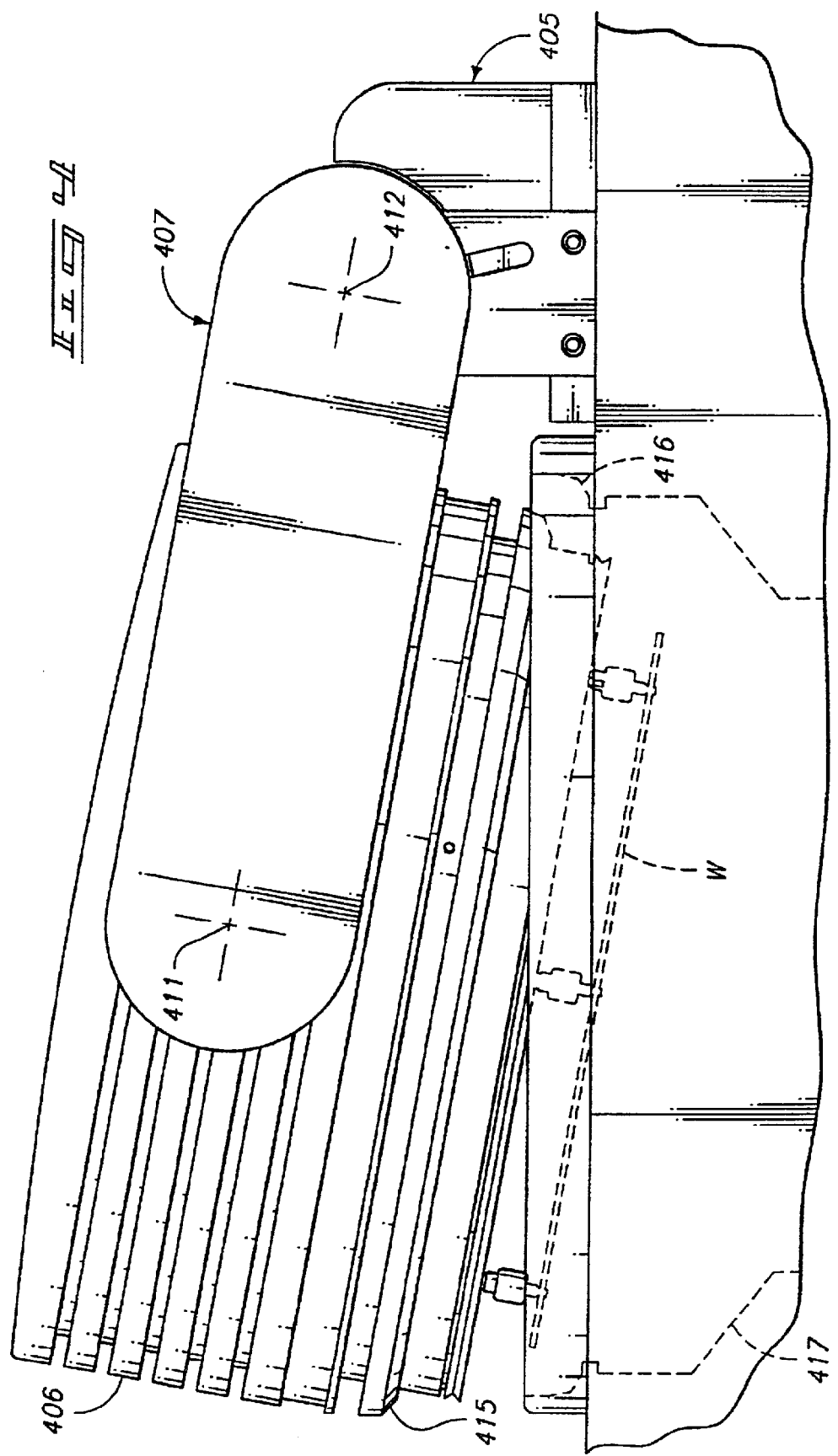
FIG. 4 is a side elevation view of the processing head of FIG. 3 showing the head in a rotated position ready to lower the wafer into the processing station.
Figure 5:
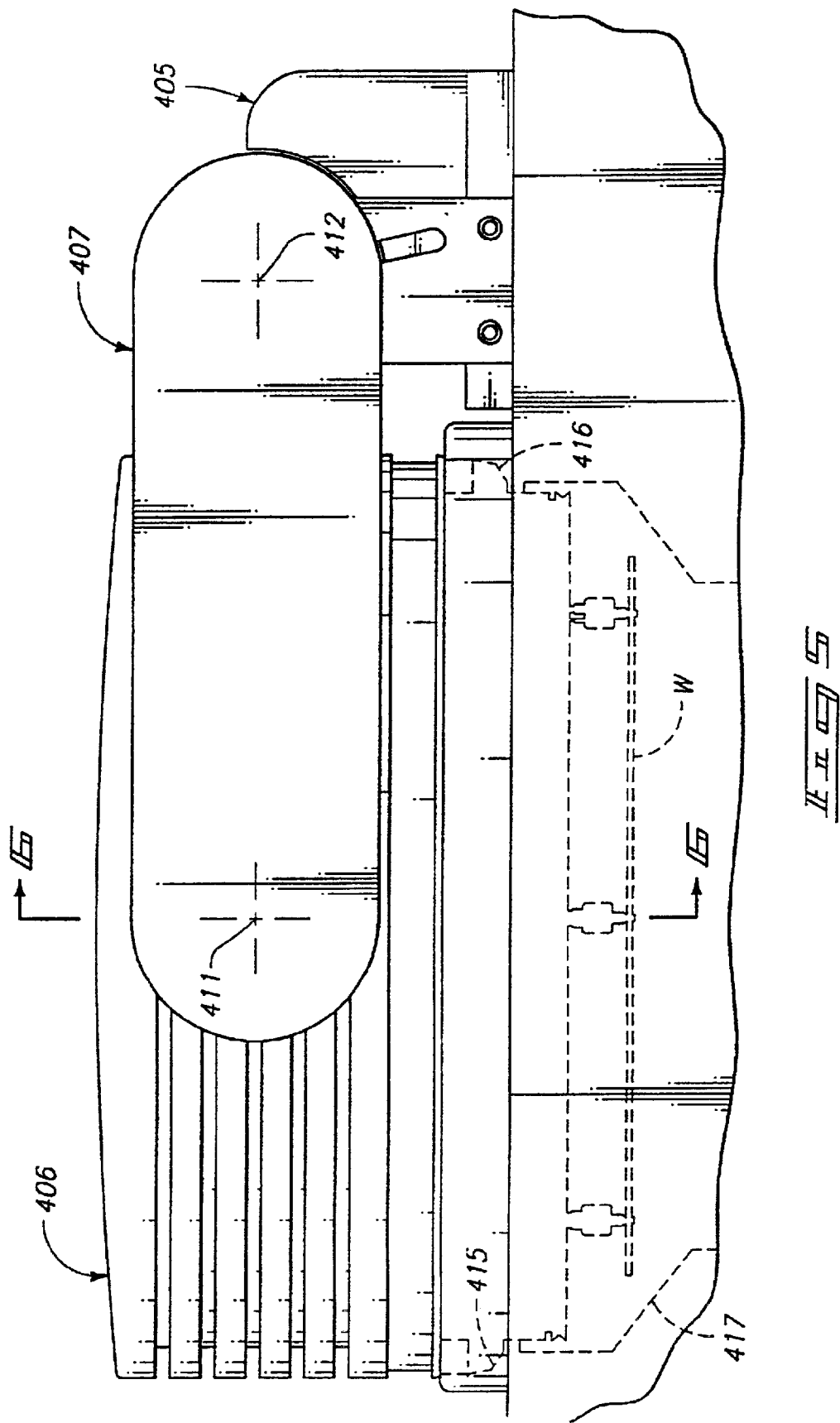
FIG. 5 is a side elevation view of the processing head of FIG. 3 showing the head operator pivoted to deploy the processing head and wafer into the bowl of the processing station.

Turning now to FIGS. 3–5, the sequence of placing a workpiece on the workpiece support and exposing the workpiece to the semiconductor manufacturing process is shown. In FIG. 3, a workpiece W is shown as being held in place by fingertips 414 of fingers 409. Workpiece W is grasped by fingertips 414 after being placed in position by robot or other means.

Once the workpiece W has been securely engaged by fingertips 414, processing head 406 can be rotated about process head pivot axis 411 as shown in FIG. 4. Process head 406 is preferably rotated about axis 411 until workpiece W is at a desired angle, such as approximately horizontal. The operator arm 407 is pivoted about operator arm pivot axis 412 in a manner so as to coordinate the angular position of processing head 406. In the closed position, the processing head is placed against the rim of bowl 416 and the workpiece W is essentially in a horizontal plane. Once the workpiece W has been secured in this position, any of a series of various semiconductor manufacturing process steps may be applied to the workpiece as it is exposed in the processing bowl 417.

Since the processing head 406 is engaged by the operator arm 407 on the left and right side by the preferably horizontal axis 411 connecting the pivot points of processing head 406, a high degree of stability about the horizontal plane is obtained. Further, since the operator arm 407 is likewise connected to the operator base 405 at left and right sides along the essentially horizontal line 412 connecting the pivot points of the operator arm, the workpiece support forms a structure having high rigidity in the horizontal plane parallel to and defined by axes 411 and 412. Finally, since operator base 405 is securely attached to the semiconductor process machine 400, rigidity about the spin axis 410 is also achieved.

Similarly, since processing head 406 is nested within the fork or yoke shaped operator arm 407 having left and right forks 418 and 419, respectively, as shown in FIG. 2, motion due to cantilevering of the processing head is reduced as a result of the reduced moment arm defined by the line connecting pivot axes 411 and 412.

In a typical semiconductor manufacturing process, the workpiece holder 408 will rotate the workpiece, having the process head 406 secured at two points, that is, at the left and right forks 418 and 419, respectively, the vibration induced by the rotation of the workpiece holder 408 will be significantly reduced along the axis 411.

A more complete description of the components of the present invention and their operation and interrelation follows.

Operator Base

Figure 9:
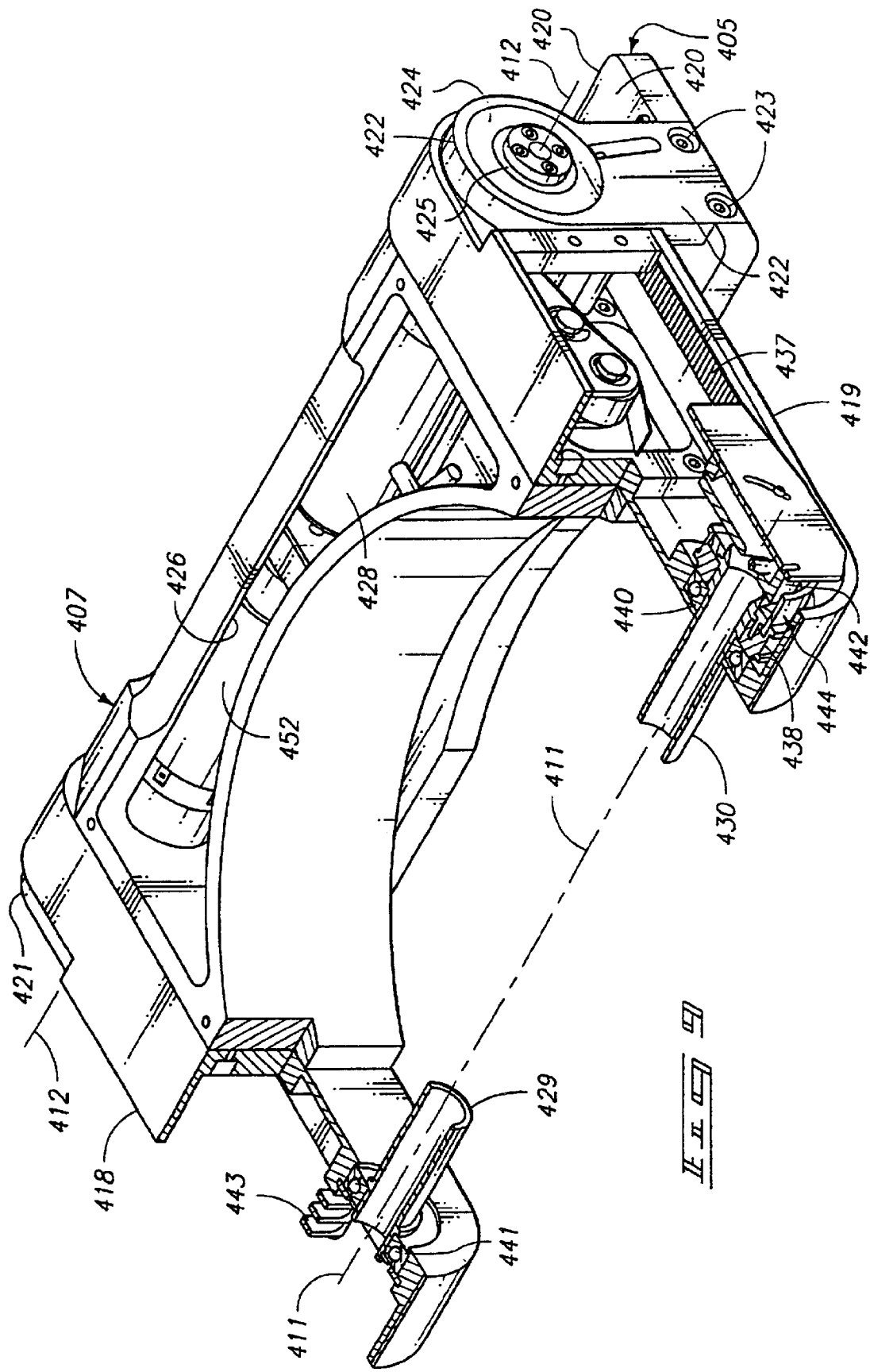
FIG. 9 is an isometric view of the operator base and operator arm of the apparatus of the present invention with the protective cover removed.

Turning now to FIG. 9, operator base 405 is shown. The present invention advantageously includes an operator base 405 which forms an essentially yoke-shaped base having an operator base back portion 420, an operator base left yoke arm 421, and an operator base right yoke arm 422. Yoke arms 421 and 422 are securely connected to the base of the yoke 420. In the preferred embodiment, the yoke arms are secured to the yoke base by the yoke arm fasteners 423. The yoke arm base in turn is advantageously connected to the semiconductor process machine 400 as shown in FIG. 1.

The upper portions of the yoke arm advantageously include receptacles for housing the operator arm bearings 424 which are used to support the pivot shafts of the operator arm 425, described more fully below.

Operator Arm

Still viewing FIG. 9, the present invention advantageously includes an operator arm 407. As described previously, operator arm 407 preferably pivots about the operator arm pivot axis 412 which connects the center line defined by the centers of operator arm pivot bearings 424.

Operator arm or pivot arm 407 is advantageously constructed in such a manner to reduce mass cantilevered about operator arm pivot axis 412. This allows for quicker and more accurate positioning of the pivot arm as it is moved about pivot arm axis 412.

Figure 10:
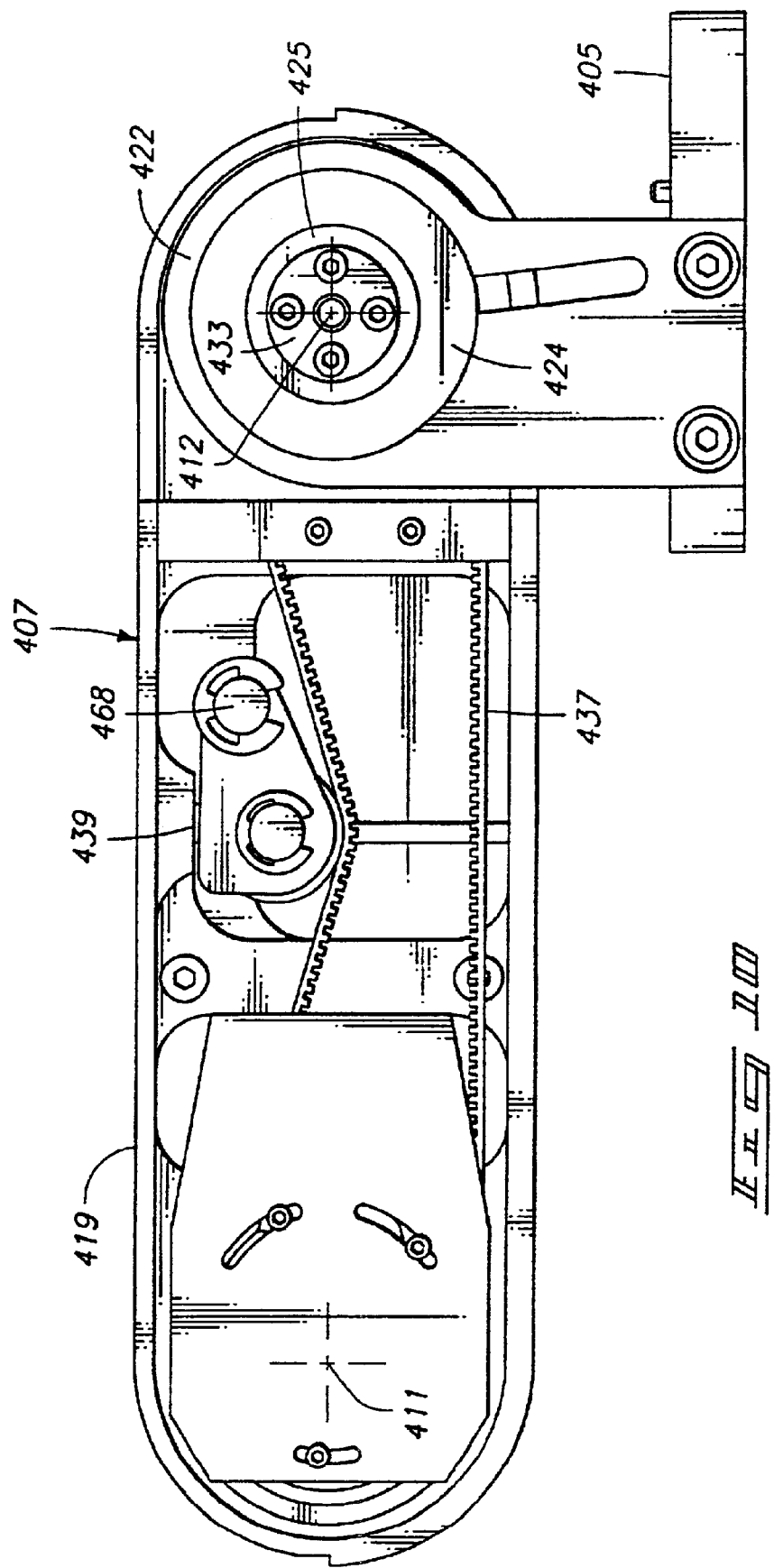
FIG. 10 is a right side elevation view of the operator arm of the present invention showing the processing head pivot drive mechanism.
Figure 11:
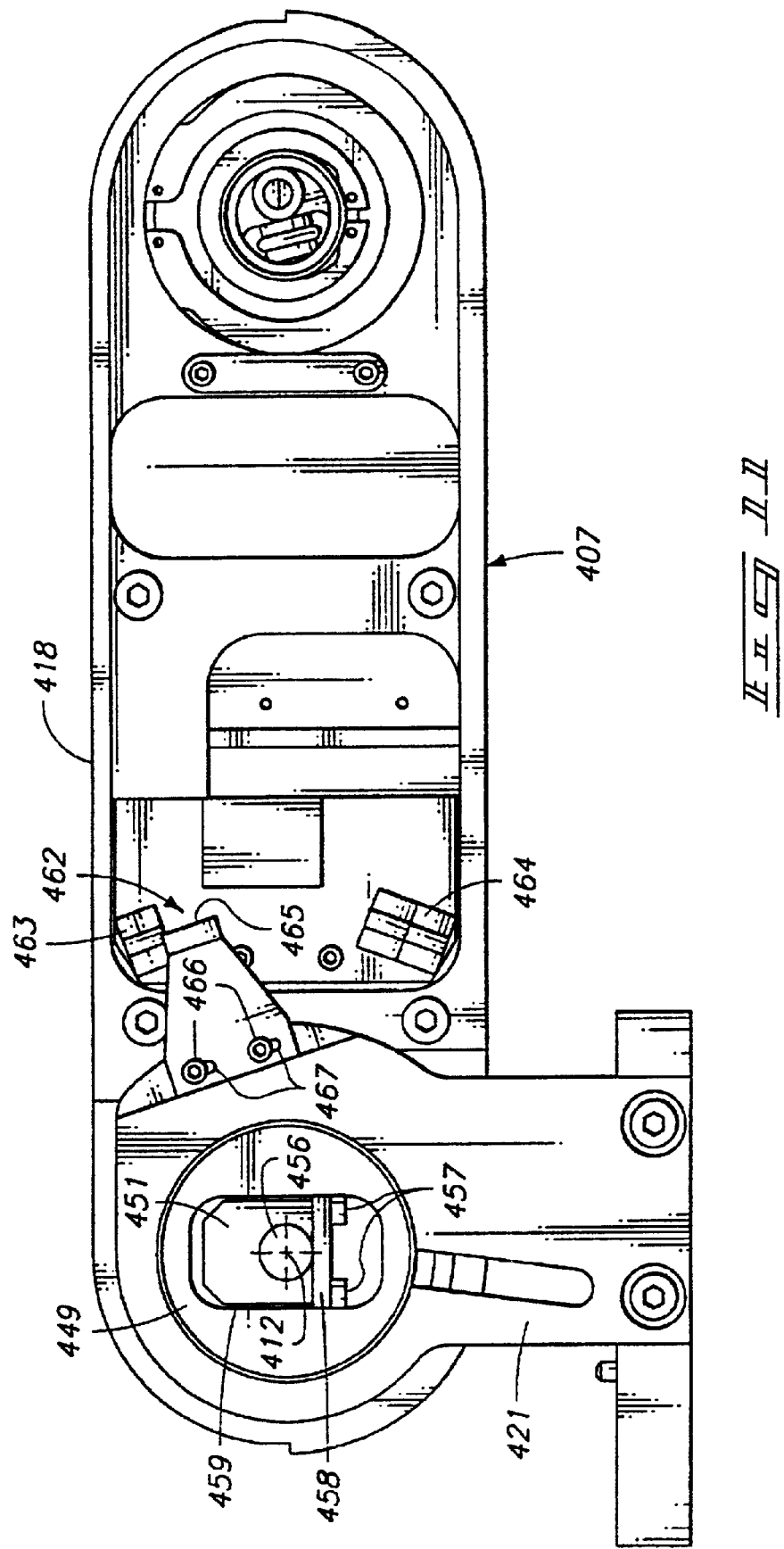
FIG. 11 is a left side elevation view of the operator arm of the present invention showing the operator arm drive mechanism.
Figure 12:
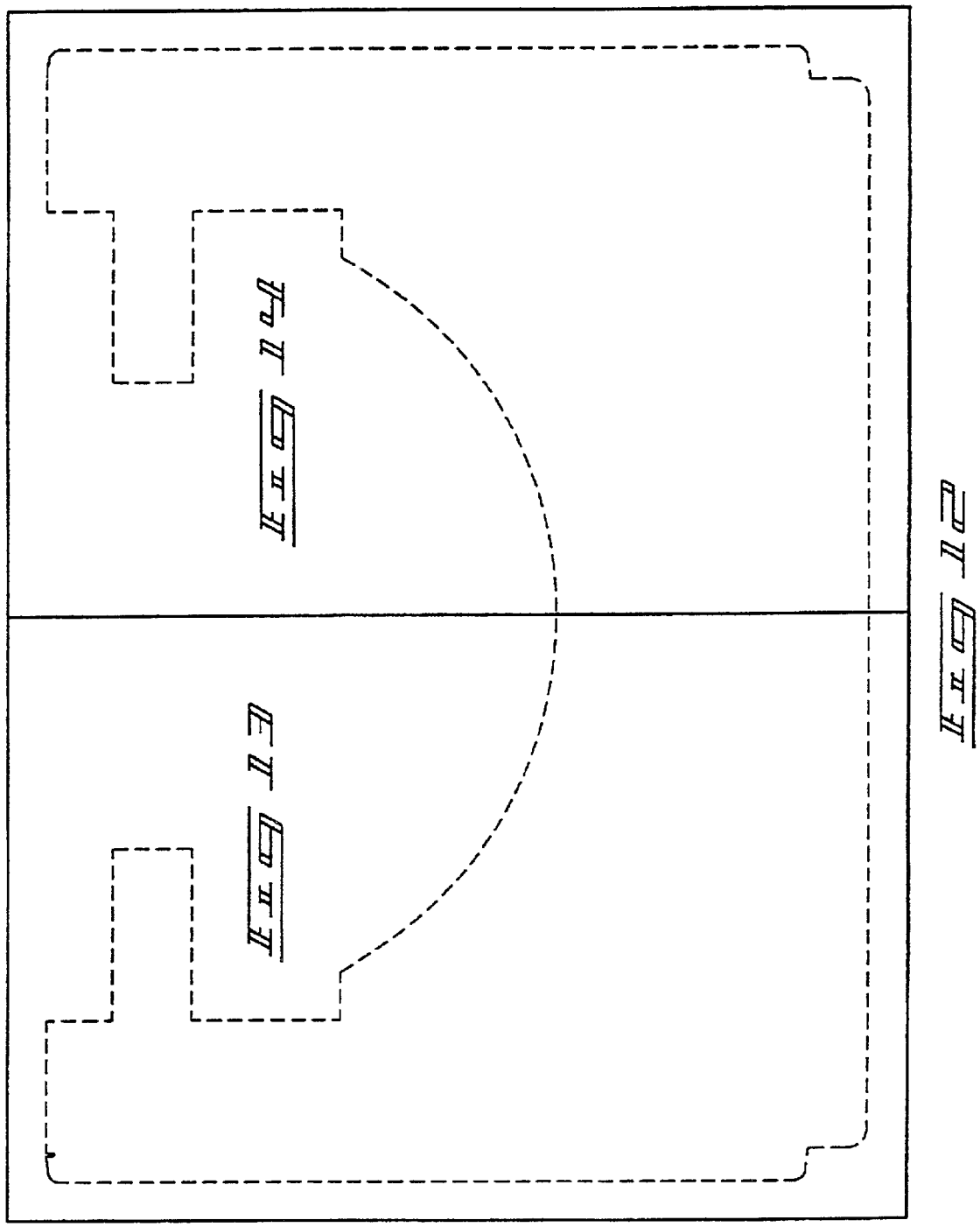
FIG. 12 is schematic plan view of the operator arm indicating the portions detailed in FIGS. 13 and 14.

The left fork of the pivot arm 418, shown more clearly in FIG. 11, houses the mechanism for causing the pivot arm to lift or rotate about pivot arm pivot axis 412. Pivot arm right fork 419, shown more clearly in FIG. 10, houses the mechanism for causing the processing head 406 (not shown) to rotate about the process head pivot axis 411.

The process arm rear cavity 426, shown in FIG. 9, houses the lift motor 452 for causing the operator arm 407 to rotate about pivot arm axis 412. Process arm rear cavity 426 also houses rotate motor 428 which is used to cause the processing head 406 to rotate about the processing head pivot axis 411. The rotate motor 428 may more generally be described as a processing head pivot or rotate drive. Processing head 406 is mounted to operator arm 407 at processing head left pivot shaft 429 and processing head right pivot shaft 430.

Operator arm 407 is securely attached to left yoke arm 421 and right yoke arm 422 by operator arm pivot shafts 425 and operator arm pivot bearings 424, the right of which such bearing shaft and bearings are shown in FIG. 9.

Operator Arm-Processing Head Rotate Mechanism

Figure 13:
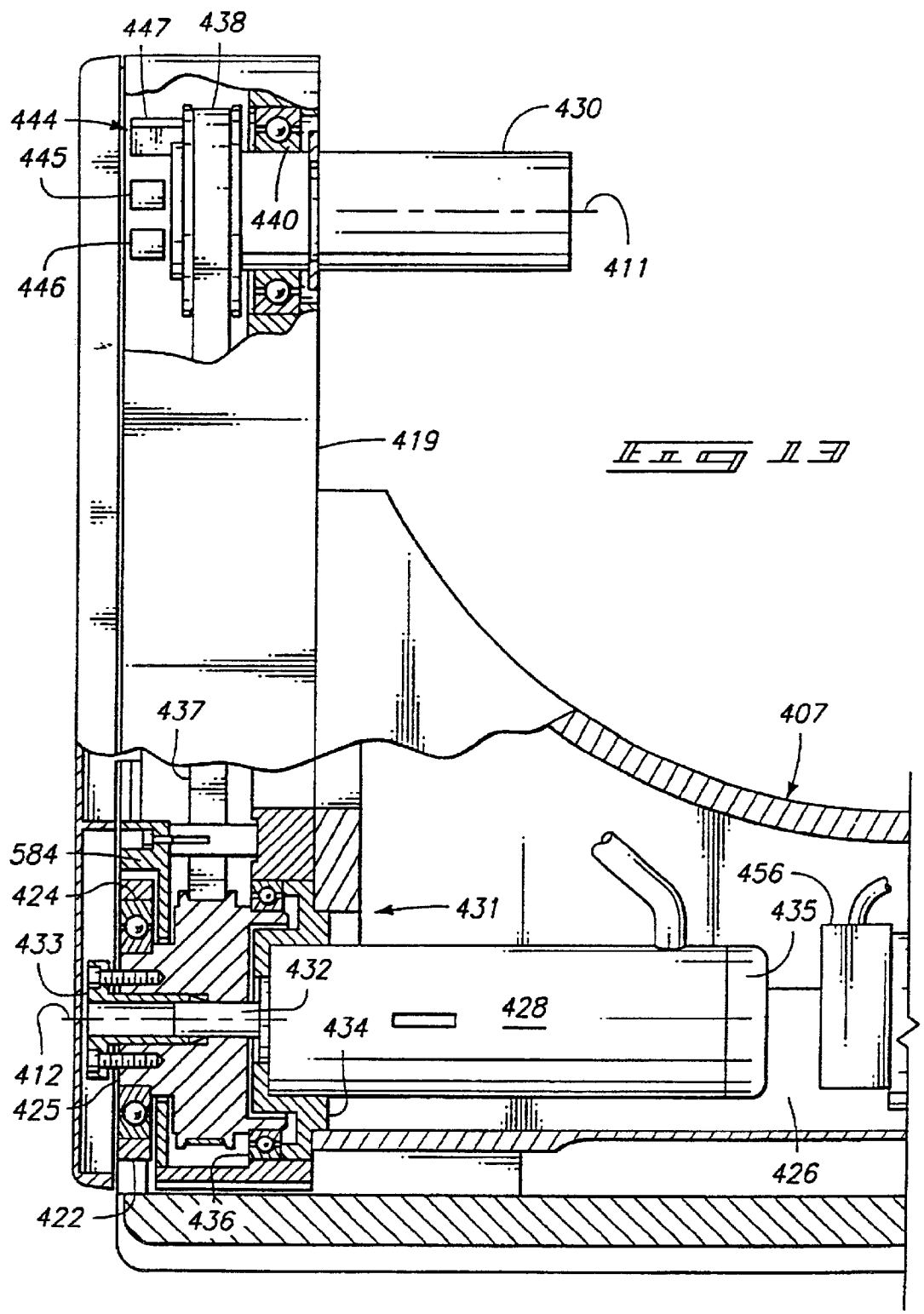
FIG. 13 is a partial sectional plan view of the right side of the operator arm showing the processing head drive mechanism.

Turning now to FIG. 13, a sectional plan view of the right rear corner of operator arm 407 is shown. The right rear section of operator arm 407 advantageously contains the rotate mechanism which is used to rotate processing head 406 about processing head pivot shafts 430 and 429. Processing head rotate mechanism 431 preferably consists of rotate motor 428 which drives rotate shaft 432, more generally described as a processing head drive shaft. Rotate shaft 432 is inserted within rotate pulley 425 which also functions as the operator arm pivot shaft. As described previously, the operator arm pivot shaft/lift pulley is supported in operator arm pivot bearings 424, which are themselves supported in operator base yoke arm 422. Rotate shaft 432 is secured within left pulley 424 by securing collar 433. Securing collar 433 secures rotate pulley 425 to rotate shaft 432 in a secure manner so as to assure a positive connection between rotate, motor 428 and rotate pulley 425. An inner cover 584 is also provided.

Rotate motor 428 is disposed within process arm rear cavity 426 and is supported by rotate motor support 434. Rotate motor 428 preferably is a servo allowing for accurate control of speed and acceleration of the motor. Servo motor 428 is advantageously connected to rotate encoder 435 which is positioned on one end of rotate motor 428. Rotate encoder 435, more generally described as a processing head encoder, allows for accurate measurement of the number of rotations of rotate motor 428, as well as the position, speed, and acceleration of the rotate shaft 432. The information from the rotate encoder may be used in a rotate circuit which may then be used to control the rotate motor when the rotate motor is a servo. This information is useful in obtaining the position and rate of travel of the processing head, as well as controlling the final end point positions of the processing head as it is rotated about process head rotate axis 411.

The relationship between the rotate motor rotations, as measured by rotate encoder 435, may easily be determined once the diameters of the rotate pulley 425 and the processing head pulley 438 are known. These diameters can be used to determine the ratio of rotate motor relations to processing head rotations. This may be accomplished by a microprocessor, as well as other means.

Rotate pulley 425 is further supported within operator arm 407 by rotate pulley inboard bearing 436 which is disposed about an extended flange on the rotate pulley 425. Rotate pulley inboard bearing 436 is secured by the body of the operator arm 407, as shown in FIG. 13.

Rotate pulley 425 advantageously drives rotate belt 437, more generally described as a flexible power transmission coupling. Referring now to FIG. 10, rotate belt 437 is shown in the side view of the right arm 419 of the operator arm 407. Rotate belt 437 is preferably a toothed timing belt to ensure positive engagement with the processing head drive wheel, more particularly described herein as the processing head pulley 438, (not shown in this view). In order to accommodate the toothed timing belt 437, both the rotate pulley 425 and the processing head pulley 438 are advantageously provided with gear teeth to match the tooth pattern of the timing belt to assure positive engagement of the pulleys with the rotate belt.

Rotate mechanism 431 is preferably provided with rotate belt tensioner 439, useful for adjusting the belt to take up slack as the belt may stretch during use, and to allow for adjustment of the belt to assure positive engagement with both the rotate pulley and the processing head pulley. Rotate belt tensioner 439 adjusts the tension of rotate belt 437 by increasing the length of the belt path between rotate pulley 425 and processing head pulley 438, thereby accommodating any excess length in the belt. Inversely, the length of the belt path may also be shortened by adjusting rotate belt tensioner 439 so as to create a more linear path in the upper portion of rotate belt 437. The tensioner 439 is adjusted by rotating it about tensioner hub 468 and securing it in a new position.

Turning now to FIG. 13, processing head pulley 438 is mounted to processing head rotate shaft 430 in a secured manner so that rotation of processing head pulley 438 will cause processing head rotate shaft 430 to rotate. Processing head shaft 430 is mounted to operator arm right fork 419 by processing head shaft bearing 440, which in turn is secured in the frame of the right fork 419 by processing head rotate bearing 469. In a like manner, processing head shaft 429 is mounted in operator arm left fork 418 by processing head shaft bearing 441, as shown in FIG. 9.

Processing head pivot shafts 430 and 429 are advantageously hollow shafts. This feature is useful in allowing electrical, optical, pneumatic, and other signal and supply services to be provided to the processing head. Service lines such as those just described which are routed through the hollow portions of processing head pivot shafts 429 and 430 are held in place in the operator arms by cable brackets 442 and 443. Cable brackets 442 and 443 serve a dual purpose. First, routing the service lines away from operating components within the operator arm left and right forks. Second, cable brackets 442 and 443 serve a useful function in isolating forces imparted to the service cables by the rotating action of processing head 406 as it rotates about processing head pivot shafts 429 and 430. This rotating of the processing head 406 has the consequence that the service cables are twisted within the pivot shafts as a result of the rotation, thereby imparting forces to the cables. These forces are preferably isolated to a particular area so as to minimize the effects of the forces on the cables. The cable brackets 442 and 443 achieve this isolating effect.

The process head rotate mechanism 431, shown in FIG. 13, is also advantageously provided with a rotate overtravel protect 444, which functions as a rotate switch. Rotate overtravel protect 444 preferably acts as a secondary system to the rotate encoder 435 should the control system fail for some reason to stop servo 428 in accordance with a predetermined position, as would be established by rotate encoder 435. Turning to FIG. 13, the rotate overtravel protect 444 is shown in plan view. The rotate overtravel protect preferably consists of rotate optical switches 445 and 446, which are configured to correspond to the extreme (beginning and end point) portions of the processing head, as well as the primary switch component which preferably is a rotate flag 447. Rotate flag 447 is securely attached to processing head pulley 438 such that when processing head shaft 430 (and consequently processing head 406) are rotated by virtue of drive forces imparted to the processing head pulley 425 by the rotate belt 437, the rotate flag 447 will rotate thereby tracking the rotate motion of processing head 406. Rotate optical switches 445 and 446 are positioned such that rotate flag 447 may pass within the optical path generated by each optical switch, thereby generating a switch signal. The switch signal is used to control an event such as stopping rotate motor 428. Rotate optical switch 445 will guard against overtravel of processing head 406 in one direction, while rotate optical switch 446 will provide against overtravel of the processing head 406 in the opposite direction.

Operator Arm-Lift Mechanism

Figure 14:
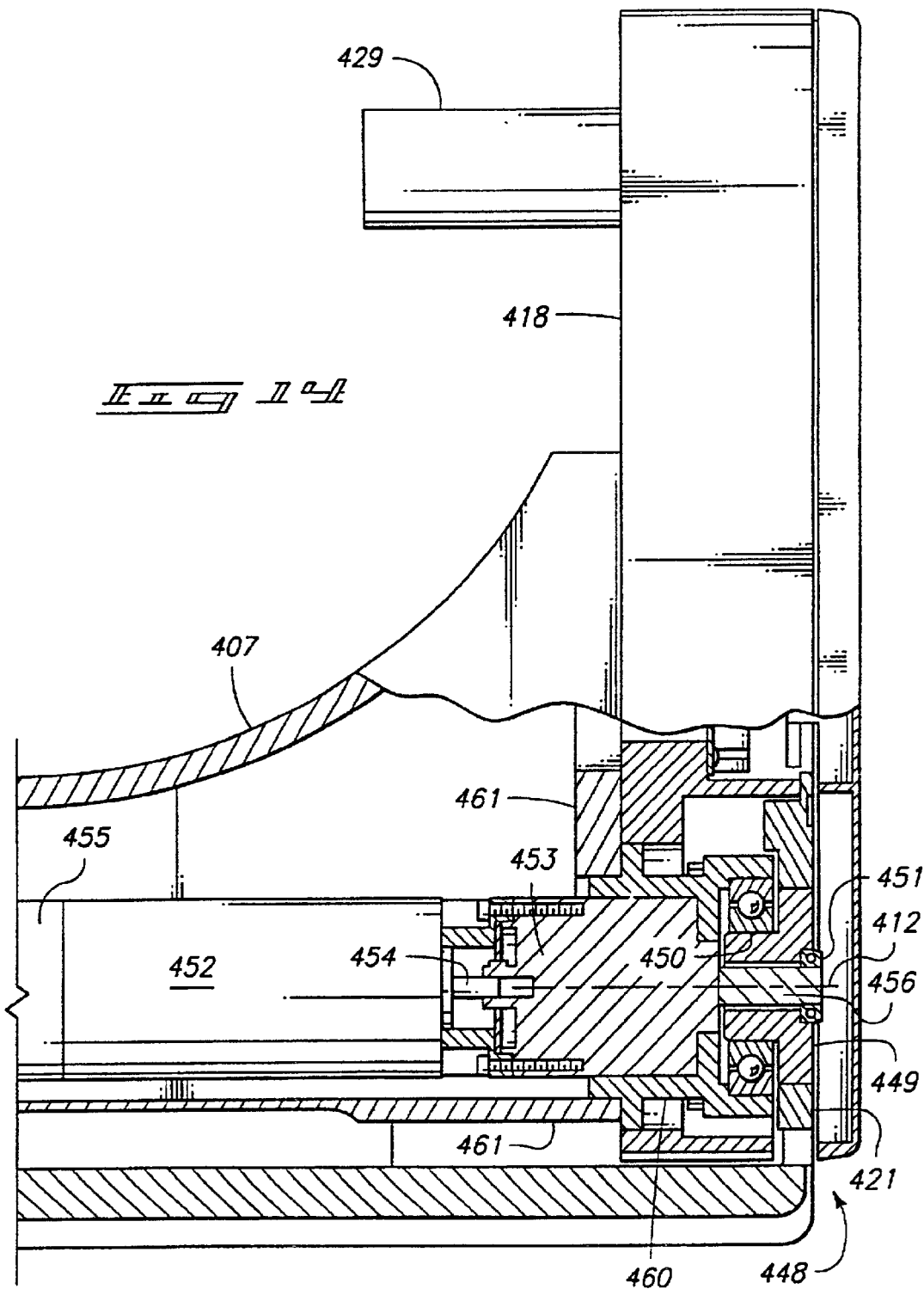
FIG. 14 is a partial sectional plan view of the left side of the operator arm showing the operator arm drive mechanism.

Operator arm 407 is also advantageously provided with an operator arm lift mechanism 448 which is useful for causing the operator arm to lift, that is, to pivot or rotate about operator arm pivot axis 412. Turning to FIG. 14, the operator arm lift mechanism 448 is shown in the sectional plan view of the right rear corner of operator arm 407.

Operator arm lift mechanism 448 is advantageously driven by lift motor 452. Lift motor 452 may be more generally described as an operator arm drive or operator arm pivot drive. Lift motor 452 is preferably a servo motor and is more preferably provided with an operator encoder, more specifically described as lift motor encoder 456. When lift motor 452 is a servo motor coupled with lift encoder 456, information regarding the speed and absolute rotational position of the lift motor shaft 454 may be known from the lift encoder signal. Additionally, by virtue of being a servo mechanism, the angular speed and acceleration of lift motor 452 may be easily controlled by use of the lift signal by an electrical circuit. Such a lift circuit may be configured to generate desired lift characteristics (speed, angle, acceleration, etc.). FIG. 14 shows that the lift operator may also include a brake 455 which is used to safely stop the arm if power fails.

Lift motor 452 drives lift motor shaft 454 which in turn drives lift gear drive 453. Lift gear drive 453 is a gear reduction drive to produce a reduced number of revolutions at lift drive shaft 456 as the function of input revolutions from lift motor shaft 454.

Lift drive gear shaft 456 is secured to lift anchor 451 which is more clearly shown in FIG. 11. Lift anchor 451 is preferably shaped to have at least one flat side for positively engaging lift bushing 449. Lift anchor 451 is secured to lift drive shaft 456 by anchor plate 458 and anchor fasteners 457. In this manner, when lift drive shaft 456 is rotated, it will positively engage lift bushing 449. Returning to FIG. 14, it is seen that lift bushing 449 is mounted in operator left yoke arm 421, and is thus fixed with respect to operator base 405. Lift bearing 450 is disposed about the lift bushing shank and is supported in operator arm 407 by lift bearing support 460 which is a bushing configured to receive lift bearing 450 on a first end and to support lift gear drive 453 on a second end. Lift bearing support 460 is further supported within operator arm 407 by operator arm frame 461. The lift arm is thus free to pivot about lift bushing 449 by virtue of lift bearing 450.

In operation, as lift motor 452 causes lift gear drive 453 to produce rotations at gear drive shaft 456, lift anchor 451 is forced against lift bushing 449 which is securely positioned within right operator yoke arm 421. The reactive force against the lift anchor 451 will cause lift bearing support 460 to rotate relative to lift bushing 449. Since lift bushing 449 is fixed in operator base 405, and since operator base 405 is fixed to processing machine 400, rotation of lift bearing support 460 will cause lift arm 407 to pivot about operator arm pivot axis 412, thereby moving the processing head 406. It is advantageous to consider the gear drive shaft (or "operator arm shaft") as being fixed with respect to operator base 405 when envisioning the operation of the lift mechanism.

Operator lift mechanism 448 is also advantageously provided with a lift overtravel protect 462 or lift switch. The lift rotate protect operates in a manner similar to that described for the rotate overtravel protect 444 described above. Turning now to FIG. 11, a left side view of the operator arm 407 is shown which shows the lift overtravel protect in detail.

The lift overtravel protect preferably includes a lift optical switch low 463 and a lift optical switch high 464. Other types of limit switches can also be used. The switch high 464 and switch low 463 correspond to beginning and endpoint travel of lift arm 407. The primary lift switch component is lift flag 465, which is firmly attached to left operator base yoke arm 421. The lift optical switches are preferably mounted to the movable operator arm 407. As operator arm 407 travels in an upward direction in pivoting about operator arm pivot axis 412, lift optical switch high 464 will approach the lift flag 465. Should the lift motor encoder 455 fail to stop the lift motor 454 as desired, the lift flag 465 will break the optical path of the lift optical switch high 464 thus producing a signal which can be used to stop the lift motor. In like manner, when the operator arm 407 is being lowered by rotating it in a clockwise direction about the operator arm pivot axis 412, as shown in FIG. 11, overtravel of operator arm 407 will cause lift optical switch low 463 to have its optical path interrupted by lift flag 465, thus producing a signal which may be used to stop lift motor 452. As is shown in FIG. 11, lift flag 465 is mounted to left operator base yoke arm 421 with slotted lift flag mounting slots 467 and removable lift flag fasteners 466. Such an arrangement allows for the lift flag to be adjusted so that the lift overtravel protect system only becomes active after the lift arm 407 has traveled beyond a preferred point.

Processing Head

Figure 6:
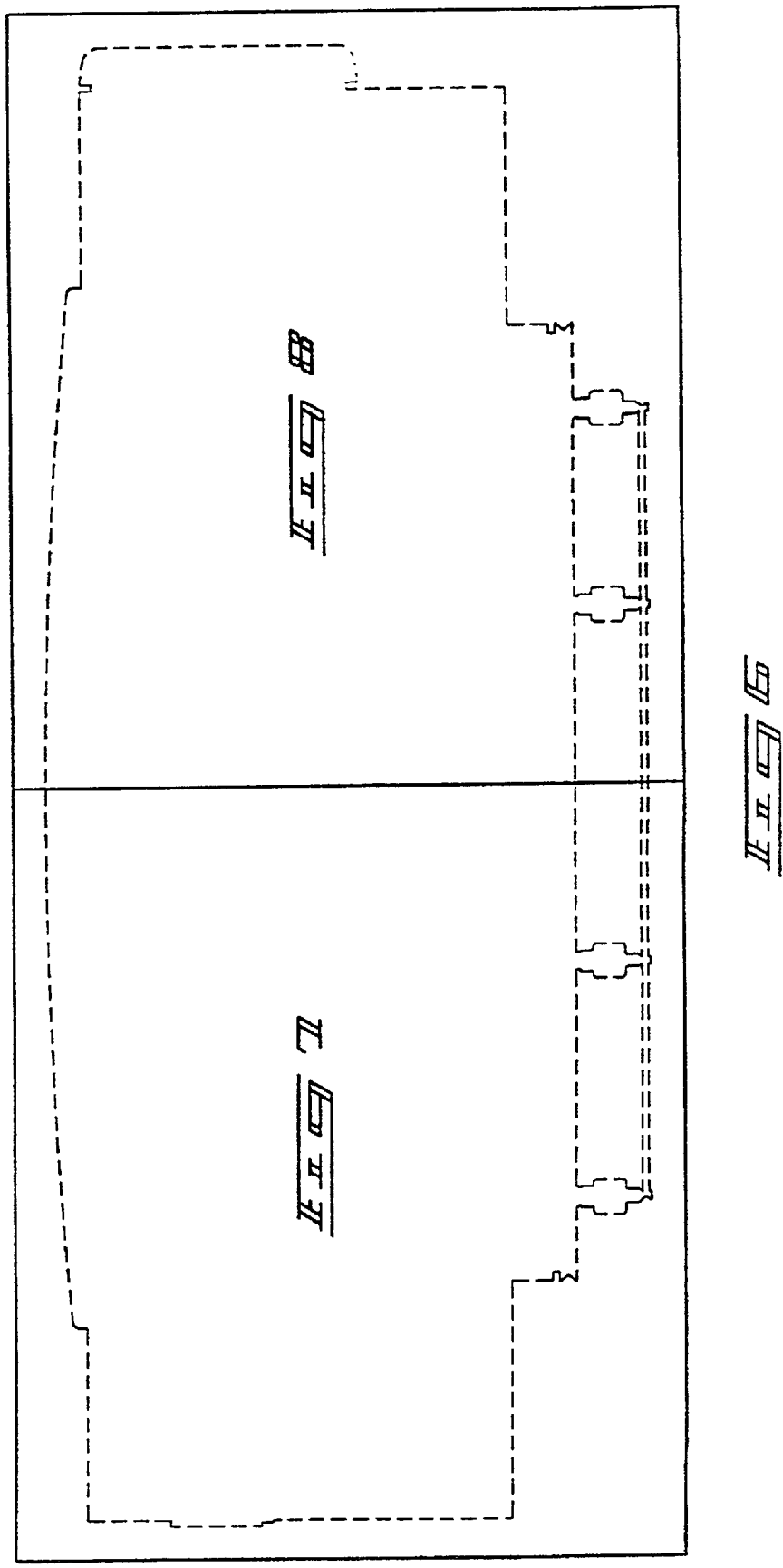
FIG. 6 is a schematic front elevation view of the processing head indicating the portions detailed in FIGS. 7 and 8.
Figure 7:
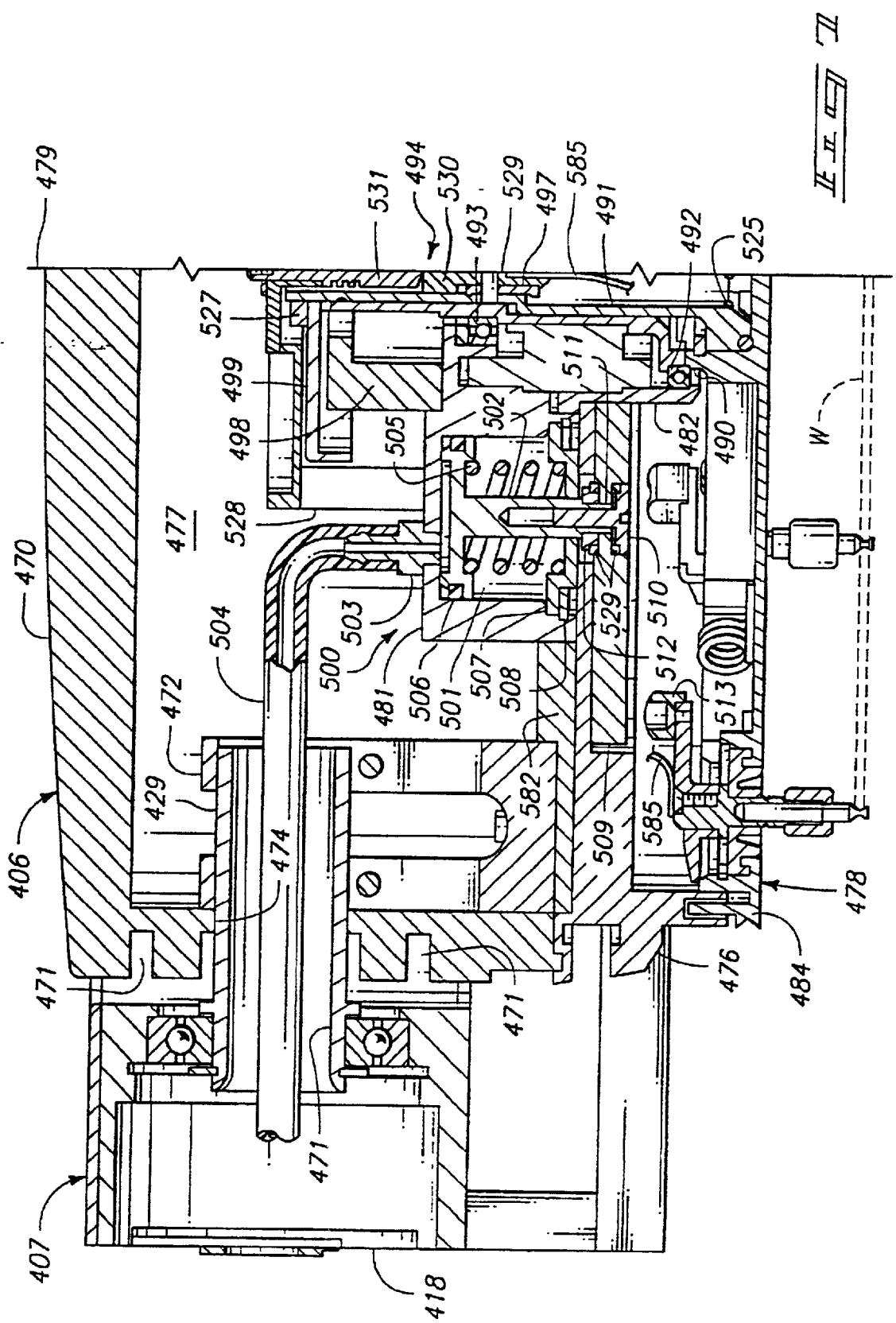
FIG. 7 is a front elevation sectional view of the left half of the processing head of the apparatus of the present invention also showing a first embodiment of the wafer holding fingers.

Turning now to FIG. 6, a front elevation schematic view of the processing head 406 is shown. Processing head 406 is described in more detail in FIGS. 7 and 8. Turning now to FIG. 7, a sectional view of the left front side of processing head 406 is shown. Processing head 406 advantageously includes a processing head housing 470 and frame 582. Processing head 406 is preferably round in shape in plan view allowing it to easily pivot about process head pivot axis 411 with no interference from operator arm 407, as demonstrated in FIGS. 3–5. Returning to FIG. 7, processing head housing 470 more preferably has circumferential grooves 471 which are formed into the side of process head housing 470. Circumferential grooves 471 have a functional benefit of increasing heat dissipation from processing head 406.

The sides of processing head housing 470 are advantageously provided with rotate shaft openings 474 and 475 for receiving respectively left and right processing head pivot shafts 429 and 430. Processing head pivot shafts 429 and 430 are secured to the processing head 406 by respective left and right processing head mounts 472 and 473. Processing head mounts 472 and 473 are affirmative connected to processing head frame 582 which also supports processing head door 476 which is itself securely fastened to processing head housing 470. Consequently, processing head pivot shafts 429 and 430 are fixed with respect to processing head 407 and may therefore rotate or pivot with respect to operator arm 407. The details of how processing head pivot shafts 429 and 430 are received within operator arm 407 were discussed supra.

Processing head housing 470 forms a processing head void 477 which is used to house additional processing head components such as the spin motor, the pneumatic finger actuators, and service lines, all discussed more filly below.

The processing head also advantageously includes a workpiece a holder and fingers for holding a workpiece, as is also more fully described below.

Processing Head Spin Motor

In a large number of semiconductor manufacturing processes, is desirable to spin the semiconductor wafer or workpiece during the process, for example to assure even distribution of applied process fluids across the face of the semiconductor wafer, or to aid drying of the wafer after a wet chemistry process. It is therefore desirable to be able to rotate the semiconductor workpiece while it is held by the processing head.

The semiconductor workpiece is held during the process by workpiece holder 478 described more fully below. In order to spin workpiece holder 478 relative to processing head 406 about spin axis 479, an electric, pneumatic, or other type of spin motor or workpiece spin drive is advantageously provided.

Figure 8:
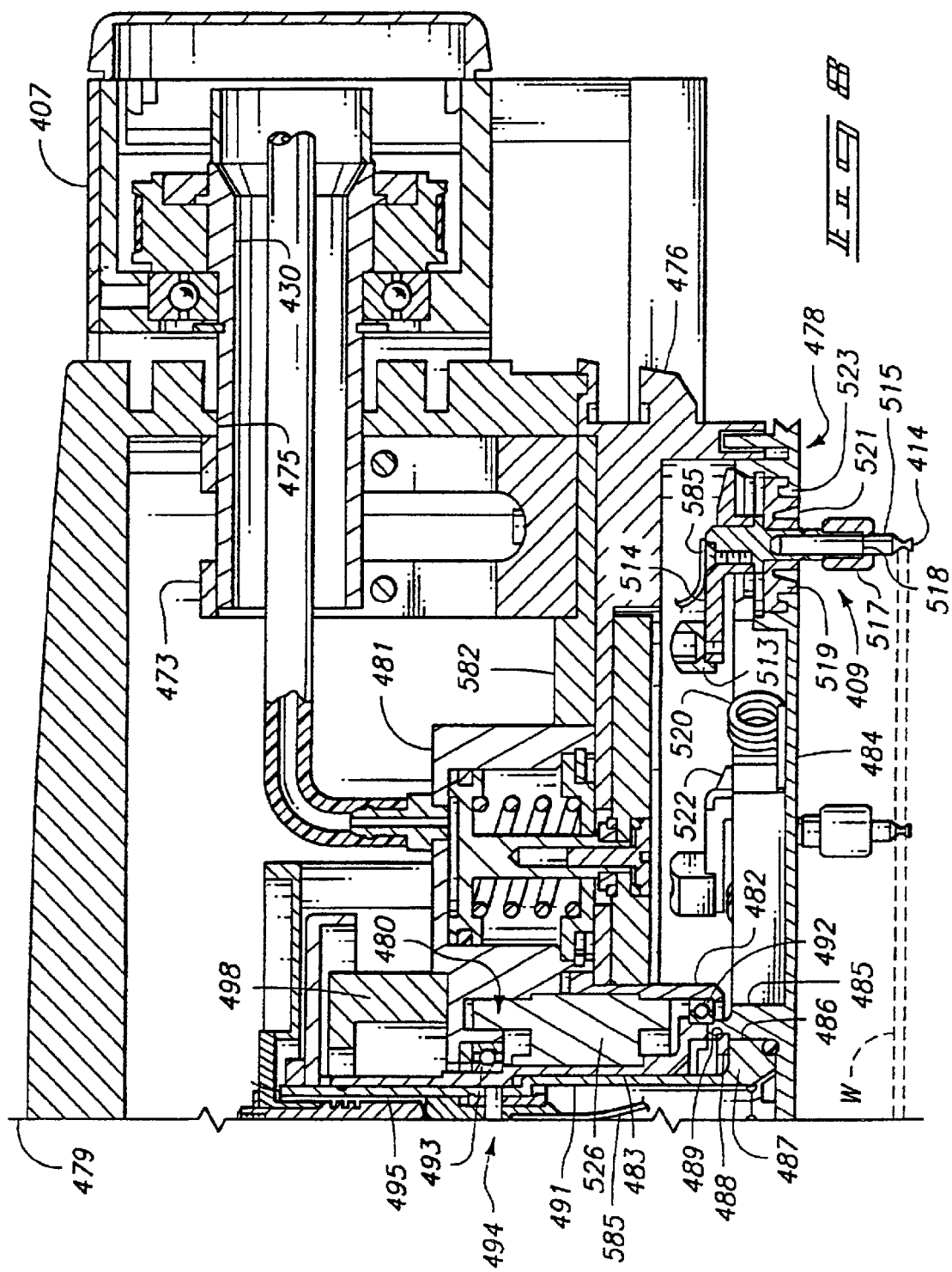
FIG. 8 is a front elevation sectional view of the left half of the processing head of the apparatus of the present invention also showing a first embodiment of the wafer holding fingers.

Turning to FIG. 8, spin motor 480 has armatures 526 which drive spin motor shaft 483 in rotational movement to spin workpiece holder 478. Spin motor 480 is supported by bottom motor bearing 492 in bottom motor housing 482. Bottom motor housing 482 is secured to processing head 406 by door 476. Spin motor 480 is thus free to rotate relative to processing head housing 470 and door 476. Spin motor 480 is preferably additionally held in place by top motor housing 481 which rests on processing head door 476. Spin motor 480 is rotationally isolated from top motor housing 481 by top motor bearing 493, which is disposed between the spin motor shaft 483 and top motor housing 481.

The spin motor is preferably an electric motor which is provided with an electrical supply source through pivot shaft 429 and/or 430. Spin motor 480 will drive spin motor shaft 483 about spin axis 479.

To secure workpiece holder rotor 484 to spin motor shaft 483, workpiece holder rotor 484 is preferably provided with a rotor hub 485. Rotor hub 485 defines a rotor hub recess 486 which receives a flared end of workpiece holder shaft 491. The flared end 487 of workpiece holder shaft 491 is secured within the rotor hub recess 486 by workpiece shaft snap-ring 488 which fits within rotor recess groove 489 above the flared portion 487 of workpiece holder shaft 491.

The workpiece holder shaft 491 is fitted inside of spin motor shaft 483 and protrudes from the top of the spin motor shaft. The top of workpiece holder shaft 491 is threaded to receive thin nut 527 (see FIG. 7). Thin nut 527 is tightened against optical tachometer 499 (describe more fully below).

Optical tachometer 499 is securely attached to spin motor shaft 483 such that as the spin motor 480 rotationally drives the spin motor shaft 483, the workpiece holder shaft 491 is also driven.

Workpiece holders may be easily changed out to accommodate various configurations which may be required for the various processes encountered in manufacturing of the semiconductors. This is accomplished by removing spin encoder 498 (described below), and then thin nut 527. Once the thin nut has been removed the workpiece holder 478 will drop away from the processing head 406.

The processing head is also advantageously provided with a spin encoder 498, more generally described as a workpiece holder encoder, and an optical tachometer 499. As shown in FIG. 7, spin encoder 498 is mounted to top motor housing 481 by encoder support 528 so as to remain stationary with respect to the processing head 406. Optical tachometer 499 is mounted on spin motor shaft 483 so as to rotate with the motor 480. When operated in conjunction, the spin encoder 498 and optical tachometer 499 allow the speed, acceleration, and precise rotational position of the spin motor shaft (and therefore the workpiece holder 478) to be known. In this manner, and when spin motor 480 is provided as a servo motor, a high degree of control over the spin rate, acceleration, and rotational angular position of the workpiece with respect to the process head 407 may be obtained.

In one application of the present invention the workpiece support is used to support a semiconductor workpiece in an electroplating process. To accomplish the electroplating an electric current is provided to the workpiece through an alternate embodiment of the fingers (described more fully below). To provide electric current to the finger, conductive wires are run from the tops of the fingers inside of the workpiece holder 478 through the electrode wire holes 525 in the flared lower part of workpiece holder shaft 491. The electrode wires are provided electric current from electrical lines run through processing pivot shaft 429 and/or 430.

The electrical line run through pivot shaft 430/429 will by nature be stationary with respect to processing head housing 470. However, since the workpiece holder rotor is intended to be capable of rotation during the electroplating process, the wires passing into workpiece support shaft 491 through electrode wire holes 525 may rotate with respect to processing head housing 470. Since the rotating electrode wires within workpiece shaft 491 and the stationary electrical supply lines run through pivot shaft 430/429 must be in electrical communication, the rotational/stationary problem must be overcome. In the preferred embodiment, this is accomplished by use of electrical slip ring 494.

Electrical slip ring 494, shown in FIG. 7, has a lower wire junction 529 for receiving the conductive ends of the electrical wires passing into workpiece holder shaft 491 by electrode wire holes 525. Lower wire junction 529 is held in place within workpiece holder shaft 491 by insulating cylindrical collar 497 and thus rotates with spin motor shaft 483. The electrode wires terminate in a single electrical contact 531 at the top of the lower wire junction 529. Electrical slip ring 494 further has a contact pad 530 which is suspended within the top of workpiece holder shaft 491. Contact pad 530 is mechanically fastened to spin encoder 498, which, as described previously, remains stationary with respect to processing head housing 470. The stationary-to-rotational transition is made at the tip of contact pad 530, which is in contact with the rotating electrical contact 531. Contact pad 530 is electrically conductive and is in electrical communication with electrical contact 531. In the preferred embodiment, contact pad 530 is made of copper-beryllium.

A wire 585 carries current to finger assemblies when current supply is needed, such as on the alternative embodiment a described below.

Processing Head Finger Actuators

Workpiece holder 478, described more fully below, advantageously includes fingers for holding the workpiece W in the workpiece holder, as shown in FIGS. 7 and 8. Since the workpiece holder 478 may be removed as described above, it is possible to replace one style of workpiece holder with another. Since a variety of workpiece holders with a variety of fingers for holding the workpiece is possible, it is desirable to have a finger actuator mechanism disposed within processing head 407 which is compatible with any given finger arrangement. The invention is therefore advantageously provided with a finger actuator mechanism.

Turning to FIG. 7, a finger actuator mechanism 500 is shown. Finger actuator mechanism 500 is preferably a pneumatically operated mechanism. A pneumatic cylinder is formed by a cavity 501 within top motor housing 481. Pneumatic piston 502 is disposed within cavity 501. Pneumatic piston 502 is biased in an upward position within cavity 501 by actuator spring 505. Actuator spring 505 is confined within cavity 501 by cavity end cap 507, which is itself constrained by retaining ring 508. Pneumatic fluid is provided to the top of pneumatic piston 502 via pneumatic inlet 503. Pneumatic fluid is provided to pneumatic inlet 503 by pneumatic supply line 504 which is routed through processing head pivot shaft 429 and hence through the left fork 418 of the operator arm 407. Turning to FIG. 8, it can be seen that a second pneumatic cylinder which is identical to the pneumatic cylinder just described is also provided.

Pneumatic piston 502 is attached to actuator plate 509 by actuator plate connect screw 510. Wave springs 529 provide flexibility to the connecting at screws 510. Actuator plate 509 is preferably an annular plate concentric with the spin motor 580 and disposed about the bottom motor housing 482, and is symmetrical about spin axis 479. Actuator plate 509 is secured against pneumatic piston 502 by bushing 512 which is disposed in pneumatic piston recess 511 about pneumatic piston 502. Bushing 512 acts as a support for wave springs 529 to allow a slight tilting of the actuator plate 509. Such an arrangement is beneficial for providing equal action against the finger actuator contracts 513 about the entire actuator plate or ring 509.

When pneumatic fluid is provided to the space above the pneumatic piston 502, the pneumatic piston 502 travels in a downward direction compressing actuator spring 505. As pneumatic piston 502 travels downward, actuator plate 509 is likewise pushed downward by flexible bushing 512. Actuator plate 509 will contact finger actuator contacts 513 causing the fingers to operate as more fully described below.

Actuator seals 506 are provided to prevent pneumatic gas from bypassing the top of the pneumatic piston 502 and entering the area occupied by actuator spring 505.

Processing Head Workpiece Holder

Workpiece holder 478 is used to hold the workpiece W, which is typically a semiconductor wafer, in position during the semiconductor manufacturing process.

Turning now to FIG. 8, a finger 409 is shown in cross section. Finger 409 advantageously includes a finger actuator contact 513 which is contacted by actuator plate 509, as described above. Finger actuator contact 513 is connected to finger actuator lever 514 (more generally, "finger extension") which is cantilevered from and connected to the finger stem 515. Finger stem 515 is inserted into finger actuator lever 514. Disposed about the portion of the finger actuator lever which encompasses and secures finger stem 515 is finger diaphragm 519. Finger diaphragm 519 is preferably made of a flexible material such as Tetrafluoroethylene, also known as Teflon® (registered trademark of E. I. DuPont de Nemours Company). Finger 409 is mounted to workpiece holder rotor 484 using finger diaphragm 519. Finger diaphragm 519 is inserted into the finger opening 521 in rotor 484. The finger diaphragm 519 is inserted into the rotor from the side opposite that to which the workpiece will be presented. Finger diaphragm 519 is secured to rotor 484 against rotor diaphragm lip 523. Forces are intentionally imparted as a result of contact between the actuator plate 509 and the finger actuator contact 513 when the finger actuator mechanism 500 is actuated.

Finger actuator lever 514 is advantageously biased in a horizontal position by finger spring 520 which acts on finger actuator tab 522 which in turn is connected to finger actuator lever 514. Finger spring 520 is preferably a torsion spring secured to the workpiece holder rotor 484.

Finger stem 515 is also preferably provided with finger collar or nut 517 which holds the finger stem 515 against shoulder 518. Finger collar 517 threads or otherwise securely fits over the lower end of finger actuator lever 514. Below the finger collar 517, finger stem 515 extends for a short distance and terminates in fingertip 414. Fingertip 414 contains a slight groove or notch which is beneficially shaped to receive the edge of the workpiece W.

In actuation, finger actuator plate 509 is pushed downward by finger actuator mechanism 500. Finger actuator plate 509 continues its downward travel contacting finger actuator contacts 513. As actuator plate 509 continues its downward travel, finger actuator contacts are pushed in a downward direction. As a result of the downward direction, the finger actuator levers 514 are caused to pivot.

In the preferred embodiment, a plurality of fingers are used to hold the workpiece. In one example, six fingers were used. Once the actuator plate 509 has traveled its full extent, the finger stems 515 will be tilted away from the spin axis 479. The circumference described by the fingertips in this spread-apart position should be greater than the circumference of the workpiece W. Once a workpiece W has been positioned proximate to the fingertips, the pneumatic pressure is relieved on the finger actuator and the actuator spring 505 causes the pneumatic piston 502 to return to the top of the cavity 501. In so doing, the actuator plate 509 is retracted and the finger actuator levers are returned to their initial position by virtue of finger springs 520.

Semiconductor Workpiece Holder-Electroplating Embodiment

Figure 15:
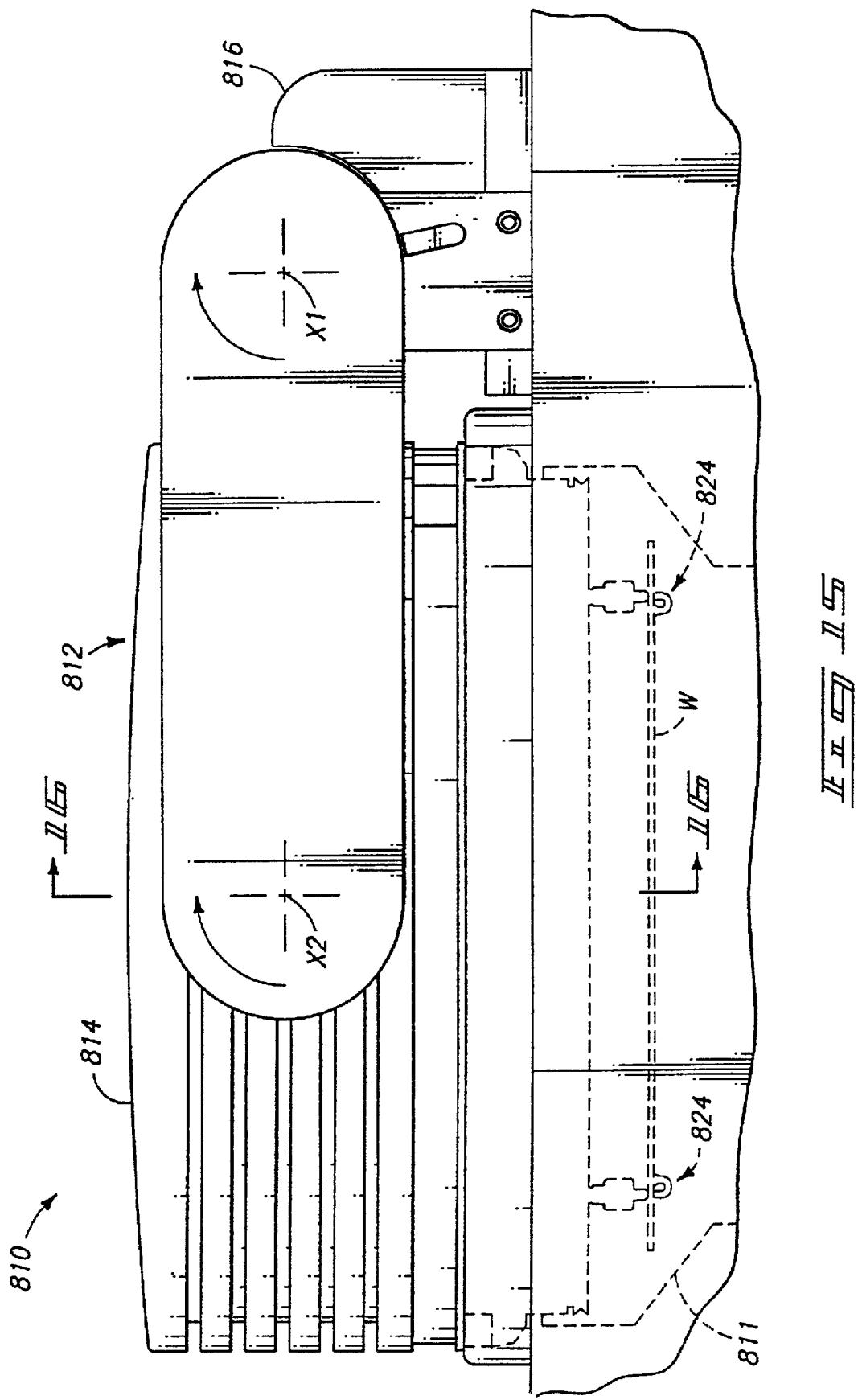
FIG. 15 is a side elevational view of a semiconductor workpiece holder constructed according to a preferred aspect of the invention.

FIG. 15 is a side elevational view of a semiconductor workpiece holder 810 constructed according to a preferred aspect of the invention.

Workpiece holder 810 is used for processing a semiconductor workpiece such as a semiconductor wafer shown in phantom at W. One preferred type of processing undertaken with workpiece holder 810 is a workpiece electroplating process in which a semiconductor workpiece is held by workpiece holder 810 and an electrical potential is applied to the workpiece to enable plating material to be plated thereon. Such can be, and preferably is accomplished utilizing a processing enclosure or chamber which includes a bottom half or bowl 811 shown in phantom lines in FIG. 1. Bottom half 811 together with workpiece holder 810 forms a sealed, protected chamber for semiconductor workpiece processing. Accordingly, preferred reactants can be introduced into the chamber for further processing. Another preferred aspect of workpiece holder 810 is that such moves, rotates or otherwise spins the held workpiece during processing as will be described in more detail below.

Processing Head and Processing Head Operator

Turning now to FIG. 15, semiconductor workpiece holder 810 includes a workpiece support 812. Workpiece support 812 advantageously supports a workpiece during processing. Workpiece support 812 includes a processing head or spin head assembly 814. Workpiece support 812 also includes a head operator or lift/rotate assembly 816. Spin head assembly 814 is operatively coupled with lift/rotate assembly 816. Spin head assembly 814 advantageously enables a held workpiece to be spun or moved about a defined axis during processing. Such enhances conformal coverage of the preferred plating material over the held workpiece. Lift/rotate assembly 816 advantageously lifts spin head assembly 814 out of engagement with the bottom half 811 of the enclosure in which the preferred processing takes place. Such lifting is preferably about an axis $x_1$. Once so lifted, lift/rotate assembly 816 also rotates the spin head and held workpiece about an axis $x_2$ so that the workpiece can be presented face-up and easily removed from workpiece support 812. In the illustrated and preferred embodiment, such rotation is about 180° from the disposition shown in FIG. 15. Advantageously, a new workpiece can be fixed or otherwise attached to the workpiece holder for further processing as described in detail below.

The workpiece can be removed from or fixed to workpiece holder 810 automatically by means of a robotically controlled arm. Alternatively, the workpiece can be manually removed from or fixed to workpiece holder 810. Additionally, more than one workpiece holder can be provided to support processing of multiple semiconductor workpieces. Other means of removing and fixing a semiconductor workpiece are possible.

Figure 16:
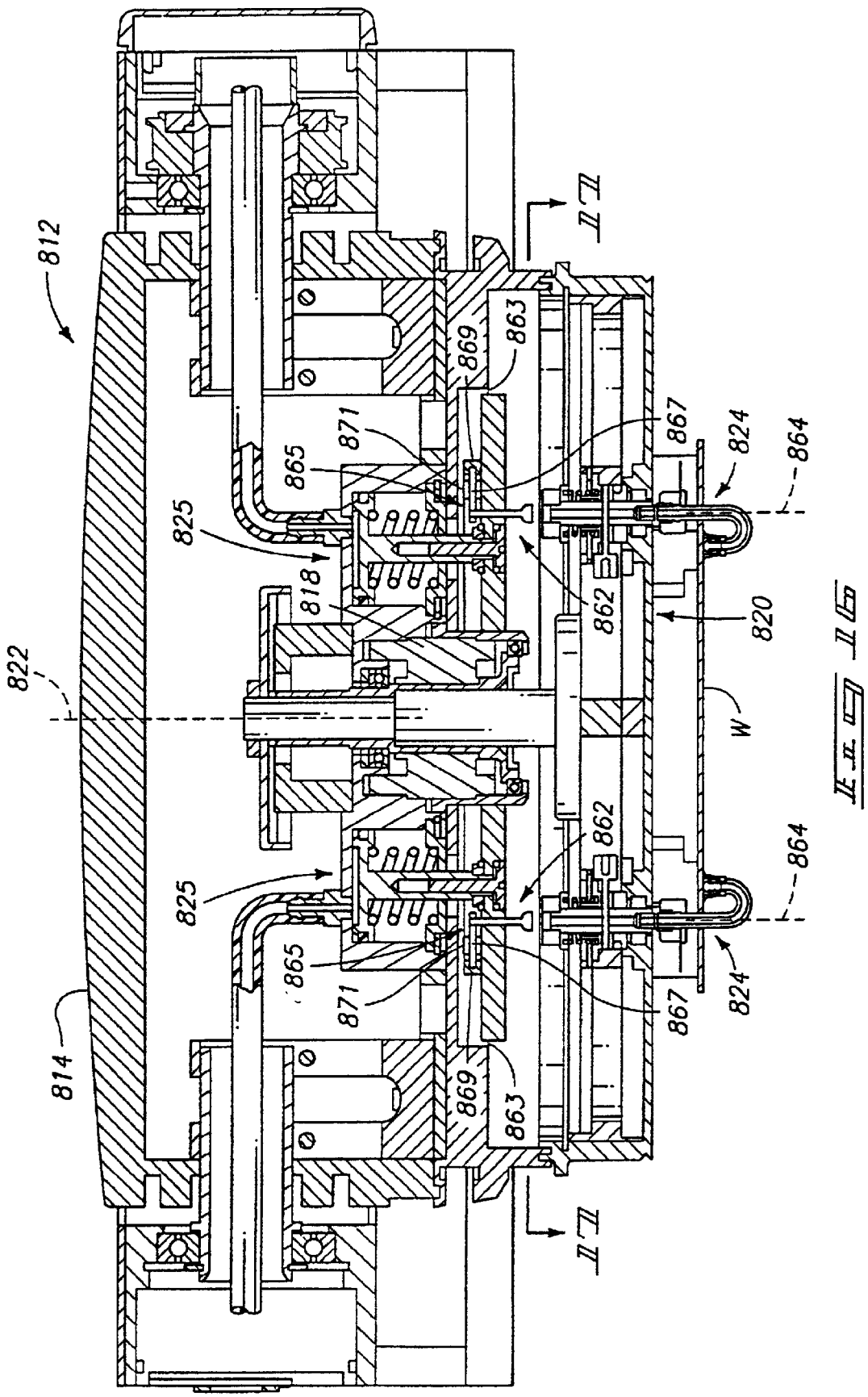
FIG. 16 is a front sectional view of the FIG. 1 semiconductor workpiece holder.

FIG. 16 is a front sectional view of the FIG. 15 semiconductor workpiece holder. As shown, workpiece support 812 includes a motor 818 which is operatively coupled with a rotor 820. Rotor 820 is advantageously mounted for rotation about a rotor spin axis 822 and serves as a staging platform upon which at least one finger assembly 824 is mounted. Preferably, more than one finger assembly is mounted on rotor 820, and even more preferably, four or more such finger assemblies are mounted thereon and described in detail below although only two are shown in FIG. 16. The preferred finger assemblies are instrumental in fixing or otherwise holding a semiconductor workpiece on semiconductor workpiece holder 810. Each finger assembly is advantageously operatively connected or associated with a actuator 825. The actuator is preferably a pneumatic linkage which serves to assist in moving the finger assemblies between a disengaged position in which a workpiece may be removed from or added to the workpiece holding, and an engaged position in which the workpiece is fixed upon the workpiece holder for processing. Such is described in more detail below.

Figure 17:
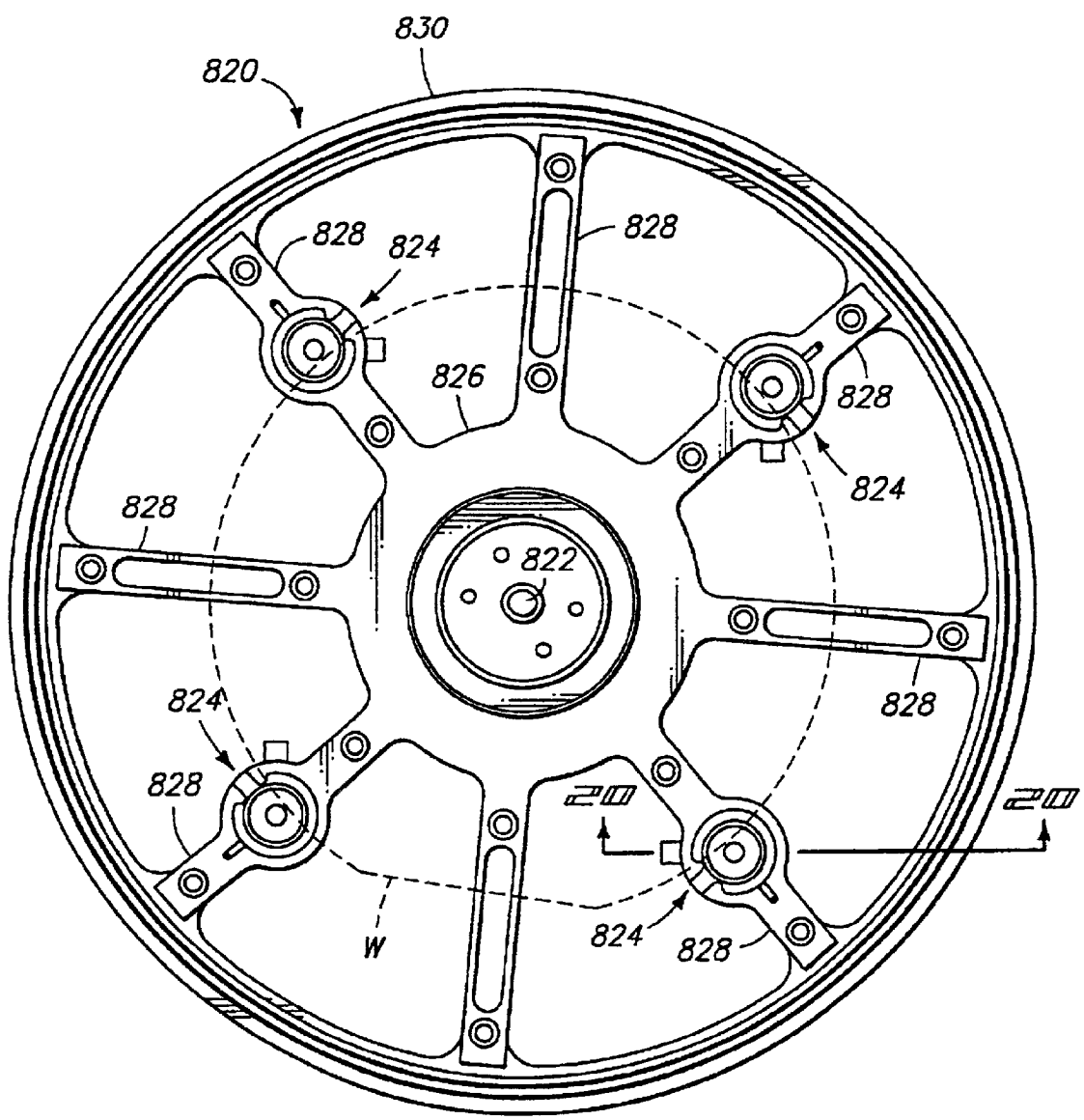
FIG. 17 is a top plan view of a rotor which is constructed in accordance with a preferred aspect of this invention, and which is taken along line 3—3 in FIG. 16.

FIG. 17 is a top or plan view of rotor 820 which is effectively taken along line 3—3 in FIG. 16. FIG. 16 shows the preferred four finger assemblies 824. As shown, rotor 820 is generally circular and resembles from the top a spoked wheel with a nearly continuous bottom surface. Rotor 820 includes a rotor center piece 826 at the center of which lies rotor axis 822. A plurality of stints or spokes 828 are joined or connected to rotor center 826 and extend outwardly to join with and support a rotor perimeter piece 830. Advantageously, four of spokes 828 support respective preferred finger assemblies 824. Finger assemblies 824 are advantageously positioned to engage a semiconductor workpiece, such as a wafer W which is shown in phantom lines in the position such would occupy during processing. When a workpiece is so engaged, it is fixedly held in place relative to the rotor so that processing can be effected. Such processing can include exposing the workpiece to processing conditions which are effective to form a layer of material on one or more surfaces or potions of a wafer or other workpiece. Such processing can also include moving the workpiece within a processing environment to enhance or improve conformal coverage of a layering material. Such processing can, and preferably does include exposing the workpiece to processing conditions which are effective to form an electroplated layer on or over the workpiece.

Finger Assembly

Referring now to FIGS. 18–20, various views of a preferred finger assembly are shown. The preferred individual finger assemblies are constructed in accordance with the description below. FIG. 18 is an isolated side sectional view of a finger assembly constructed in accordance with a preferred aspect of the invention. FIG. 19 is a side elevational view of the finger assembly turned 90° from the view of FIG. 18. FIG. 20 is a fragmentary cross-sectional enlarged view of a finger assembly and associated rotor structure. The finger assembly as set forth in FIGS. 18 and 19 is shown in the relative position such as it would occupy when processing head or spin head assembly 814 (FIGS. 15 and 16) is moved or rotated by head operator or lift/rotate assembly 816 into a position for receiving a semiconductor workpiece. The finger assembly is shown in FIGS. 18 and 20 in an orientation of about 180° from the position shown in FIG. 20. This typically varies because spin head assembly 814 is rotated 180° from the position shown in FIGS. 15 and 16 in order to receive a semiconductor workpiece. Accordingly, finger assemblies 824 would be so rotated. Lesser degrees of rotation are possible.

Finger assembly 824 includes a finger assembly frame 832. Preferably, finger assembly frame 832 is provided in the form of a sealed contact sleeve which includes an angled slot 832a, only a portion of which is shown in FIG. 19. Angled slot 832a advantageously enables the finger assembly to be moved, preferably pneumatically, both longitudinally and rotationally as will be explained below. Such preferred movement enables a semiconductor workpiece to be engaged, electrically contacted, and processed in accordance with the invention.

Finger assembly frame 832 includes a finger assembly frame outer flange 834 which, as shown in FIG. 20, engages an inner drive plate portion 836 of rotor 820. Such engagement advantageously fixes or seats finger assembly frame 832 relative to rotor 820. Such, in turn, enables the finger assembly, or a portion thereof, to be moved relative to the rotor for engaging the semiconductor workpiece.

Finger Assembly Drive System

Referring to FIGS. 16 and 18–20, the finger assembly includes a finger assembly drive system which is utilized to move the finger assembly between engaged and disengaged positions. The finger assembly drive system includes a bearing 838 and a collet 840 operatively adjacent the bearing. Bearing 838 includes a bearing receptacle 839 for receiving a pneumatically driven source, a fragmented portion of which is shown directly above the receptacle in FIG. 20. The pneumatically driven source serves to longitudinally reciprocate and rotate collet 840, and hence a preferred portion of finger assembly 824. A preferred pneumatically driven source is described below in more detail in connection with the preferred longitudinal and rotational movement effectuated thereby. Such longitudinal reciprocation is affected by a biasing mechanism in the form of a spring 842 which is operatively mounted between finger assembly frame 832 and a spring seat 844. The construction develop a bias between finger assembly frame 832 and spring seat 844 to bias the finger into engagement against a wafer. Advantageously, the cooperation between the above mentioned pneumatically driven source as affected by the biasing mechanism of the finger assembly drive system, enable collet 840 to be longitudinally reciprocated in both extending and retracting modes of movement. As such, finger assembly 824 includes a biased portion which is biased toward a first position and which is movable to a second position away from the first position. Other manners of longitudinally reciprocating the finger assembly are possible.

Finger Assembly Electrical System

Referring to FIGS. 16 and 19, the finger assembly preferably includes a finger assembly electrical system which is utilized to effectuate an electrical bias to a held workpiece and supply electrical current relative thereto. The finger assembly electrical system includes a pin connector 846 and a finger 848. Pin connector 846 advantageously provides an electrical connection to a power source (not shown) via wire 585 and associate slip ring mechanism, described above in connection with FIG. 7 and other Figs. This is for delivering an electrical bias and current to an electrode which is described below. Pin connector 846 also rides within angled slot 832a thereby mechanically defining the limits to which the finger assembly may be both longitudinally and rotationally moved.

Finger 848 is advantageously fixed or secured to or within collet 840 by a nut 850 which threadably engages a distal end portion of collet 840 as shown best in FIG. 18. An anti-rotation pin 852 advantageously secures finger 848 within collet 840 and prevents relative rotation therebetween. Electrical current is conducted from connector 846 through collet 840 to finger 860, all of which are conductive, such as from stainless steel. The finger and collet can be coated with a suitable dielectric coating 856, such as TEFLON or others. The collet 840 and finger member 860 are in one form of the invention made hollow and tubular to conduct a purge gas therethrough.

Finger assembly 824 may also optionally include a distal tip or finger tip 854. Tip 854 may also have a purge gas passage formed therethrough. Finger tip 854 advantageously engages against a semiconductor workpiece (see FIG. 20) and assists in holding or fling the position of the workpiece relative to workpiece holder 810. Finger tip 854 also assists in providing an operative electrical connection between the finger assembly and a workpiece to which an electrical biased is to be applied and through which current can move. Finger tip 85 can include an electrode contact 858 for electrically contacting so a surface of a semiconductor workpiece once such workpiece is secured as describe below.

Finger Assembly Drive System Interface

A finger assembly drive system interface is operatively coupled with the finger assembly drive system to effectuate movement of the finger assembly between the engaged and disengaged positions. A preferred finger assembly drive system interface is described with reference to FIGS. 16 and 20. One component of the finger assembly drive system interface is a finger actuator 862. Finger actuator 862 is advantageously provided for moving the finger assembly between the engaged and disengaged position. Finger actuator 862 acts by engaging bearing receptacle 839 and moving finger assembly 824 between an engaged position and a disengaged position. In the engaged position, finger tip 854 is engaged against a semiconductor workpiece. In the disengaged position finger tip 854 is moved away from the workpiece.

The finger assembly drive system interface includes pneumatic actuator 825 (FIG. 16). Pneumatic actuators 825 are operatively connected to an actuation ring 863 and operates thereupon causing the drive plate to move reciprocally in the vertical direction as viewed in FIG. 16. Finger actuator 862 is operatively connected to actuation ring 863 in a manner which, upon pneumatic actuation, moves the finger actuator into engagement with bearing receptacle 839 along the dashed line in FIG. 20. Such allows or enables the finger assembly to be moved longitudinally along a first movement path axis 864.

Pneumatic actuator linkage 825 also includes a secondary linkage 865. Secondary linkage 865 is pneumatic as well and includes a link arm 867. Link arm 867 is connected or joined to an actuator torque ring 869. Preferably, torque ring 869 is concentric with rotor 820 (FIG. 17) and circuitously links each of the finger actuators together. A pneumatic operator 871 is advantageously linked with the secondary linkage 865 for applying force and operating the linkage by angularly displacing torque ring 869. This in turn rotates the finger assemblies into and away from the engaged position.

Preferably finger actuator engagement bits 862, under the influence of pneumatic linkage 825, moves the finger assembly, and more specifically collet 840 and finger 848 along a first axial movement path along axis 864. The finger actuator engagement bits 862, then under the influence of pneumatic operator 871 are turned about the axes of each bit like a screwdriver. This moves collet 840 and finger 848 in a second angular movement. Such second movement turns the fingers sufficiently to produce the angular displacement shown in FIG. 21. According to a preferred aspect of this invention, such movement of the finger assemblies between the engaged and disengaged positions takes place when spin head assembly 814 has been moved 180° from its FIG. 15 disposition into a face-up condition.

The engagement bits 862 can be provided with a purge gas passage therethrough. Gas is supplied via tube 893 and is passed through the finger assemblies.

Engaged and Disengaged Positions

Figure 21:
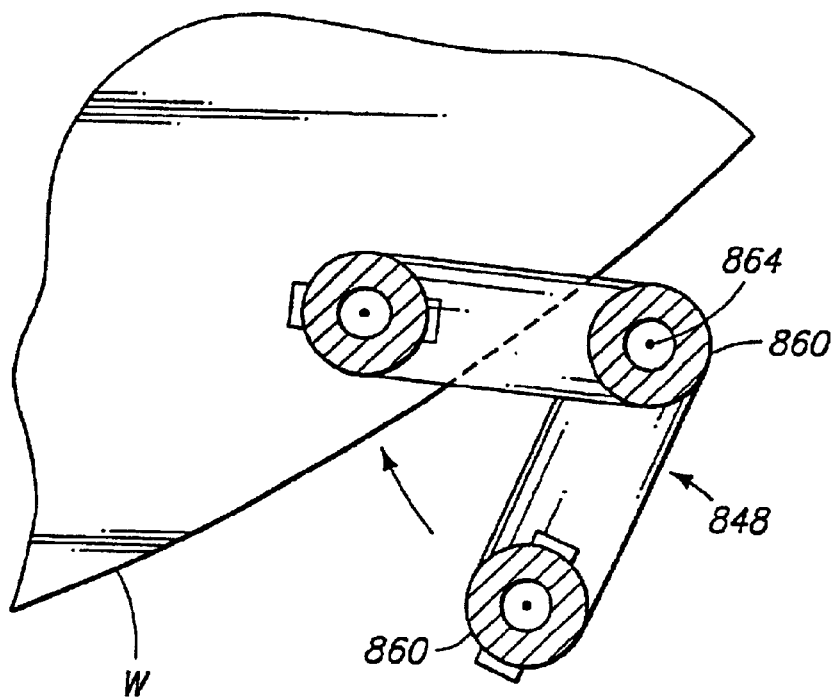
FIG. 21 is a view taken along line 7—7 in FIG. 4 and shows a portion of the preferred finger assembly moving between an engaged and disengaged position.

FIG. 21 is a view of a portion of a finger assembly, taken along line 7—7 in FIG. 18. Such shows in more detail the above-described engaged and disengaged positions and movement therebetween relative to a workpiece W. In the disengaged position, finger 848 is positioned adjacent the semiconductor workpiece and the finger tip and electrode contact do not overlap with workpiece W. In the engaged position, the finger tip overlaps with the workpiece and the electrode is brought to bear against the workpiece. From the disengaged position, finger assembly 824, upon the preferred actuation, is moved in a first direction away from the disengaged position. Preferably, such first direction is longitudinal and along first movement path axis 864. Such longitudinal movement is linear and in the direction of arrow A as shown in FIGS. 18 and 19. The movement moves the finger assembly to the position shown in dashed lines in FIG. 18. Such movement is effectuated by pneumatic operator 825 which operates upon actuation ring 863 (FIG. 16) This in turn, causes finger actuator 862 to engage with finger assembly 824. Such linear movement is limited by angled slot 832a. Thereafter, the finger assembly is preferably moved in a second direction which is different from the first direction and preferably rotational about the first movement path axis 864. Such is illustrated in FIG. 21 where the second direction defines a generally arcuate path between the engaged and disengaged positions. Such rotational movement is effectuated by secondary linkage 865 which pneumatically engages the finger actuator to effect rotation thereof. As so moved, the finger assembly swings into a ready position in which a semiconductor workpiece is ready to be engaged and held for processing. Once the finger assembly is moved or swung into place overlapping a workpiece, the preferred finger actuator is spring biased and released to bear against the workpiece. An engaged workpiece is shown in FIG. 20 after the workpiece has been engaged by finger tip 854 against a workpiece standoff 865, and spin head assembly 814 has been rotated back into the position shown in FIG. 15. Such preferred pneumatically assisted engagement takes place preferably along movement path axis 864 and in a direction which is into the plane of the page upon which FIG. 21 appears.

As shown in FIG. 18, finger 848 extends away from collet 840 and preferably includes a bend 866 between collet 840 and finger tip 854. The preferred bend is a reverse bend of around 180° which serves to point finger tip 854 toward workpiece W when the finger assembly is moved toward or into the engaged position (FIG. 21). Advantageously, the collet 840 and hence finger 848 are longitudinally reciprocally movable into and out of the engaged position.

Finger Assembly Seal

The finger assembly preferably includes a finger assembly seal 868 which is effectuated between finger 848 and a desired workpiece when the finger assembly is moved into the engaged position. Preferably, adjacent finger tip 854. Seal 868 is mounted adjacent electrode contact 858 and effectively seals the electrode contact therewithin when finger assembly 824 is moved to engage a workpiece. The seal can be made of a suitable flexible, preferably elastomeric material, such as VITON.

Figure 22:
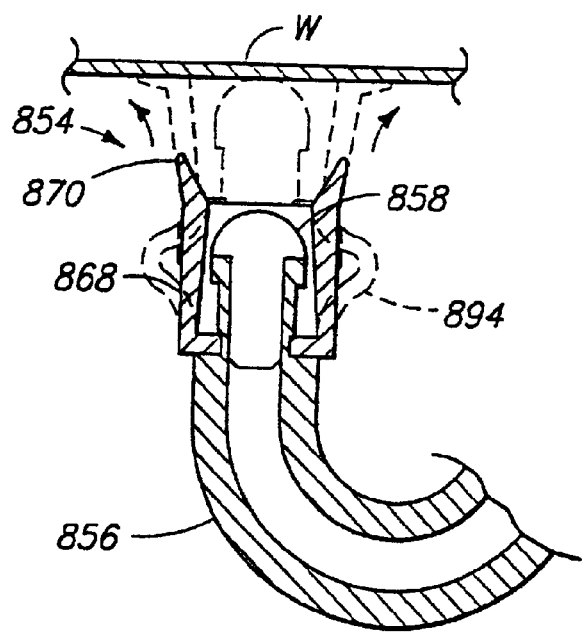
FIG. 22 is a view of a finger tip of the preferred finger assembly and shows an electrode tip in a retracted or disengaged position (solid lines) and an engaged position (phantom lines) against a semiconductor workpiece.

More specifically, and referring to FIG. 22, seal 868 can include a rim portion 870 which engages workpiece surface W and forms a sealing contact therebetween when the finger assembly is moved to the engaged position. Such seal advantageously isolates finger electrode 860 from the processing environment and materials which may plate out or otherwise be encountered therein. Seal 868 can be provided with an optional bellows wall structure 894 (FIG. 22), that allows more axial flexibility of the seal.

FIG. 22 shows, in solid lines, seal 868 in a disengaged position in which rim portion 870 is not engaged with workpiece W. FIG. 22 also shows, in phantom lines, an engaged position in which rim portion 870 is engaged with and forms a seal relative to workpiece W. Preferably and advantageously, electrode contact 858 is maintained in a generally retracted position within seal 868 when the finger assembly is in the disengaged position. However, when the finger assembly is moved into the engaged position, seal 868 and rim portion 870 thereof splay outwardly or otherwise yieldably deform to effectively enable the electrode and hence electrode contact 858 to move into the engaged position against the workpiece. One factor which assists in forming the preferred seal between the rim portion and the workpiece is the force which is developed by spring 842 which advantageously urges collet 840 and hence finger 860 and finger tip 858 in the direction of and against the captured workpiece. Such developed force assists in maintaining the integrity of the seal which is developed in the engaged position. Another factor which assists in forming the preferred seal is the yieldability or deformability of the finger tip when it is brought into contact with the workpiece. Such factors effectively create a continuous seal about the periphery of electrode contact 858 thereby protecting it from any materials, such as the preferred plating materials which are used during electroplate processing.

Methods and Operation

In accordance with a preferred processing aspect of the present invention, and in connection with the above-described semiconductor workpiece holder, a sheathed electrode, such as electrode 860, is positioned against a semiconductor workpiece surface in a manner which permits the electrode to impart a voltage bias and current flow to the workpiece to effectuate preferred electroplating processing of the workpiece. Such positioning not only allows a desired electrical bias to be imparted to a held workpiece, but also allows the workpiece itself to be mechanically held or fixed relative to the workpiece holder. That is, finger assembly 824 provides an electrical/mechanical connection between a workpiece and the workpiece holder as is discussed in more detail below.

Electrode 856 includes an electrode tip or electrode contact 858 which engages the workpiece surface. A seal is thus formed about the periphery of the electrode tip or contact 858 so that a desired electrical bias may be imparted to the workpiece to enable plating material to be plated thereon. According to a preferred aspect of the processing method, the electrode is moved in a first direction, preferably longitudinally along a movement axis, away from a disengaged position in which the workpiece surface is not engaged by the electrode tip or contact 858. Subsequently, the electrode is rotated about the same movement axis and toward an engaged position in which the electrode tip may engage, so as to fix, and thereafter bias the workpiece surface. Such preferred movement is effectuated by pneumatic linkage 825 and pneumatic operator 871 as described above.

According to a preferred aspect of the invention, the seal which is effectuated between the electrode member and the workpiece is formed by utilizing a yieldable, deformable seal member 868 which includes a rim portion 870. The rim portion 870 serves by contacting the workpiece surface to form a continuous seal as shown in FIG. 8. The preferred electrode tip is brought into engagement with the workpiece surface by advancing the electrode tip from a retracted position within the seal or other sheath to an unretracted position in which the workpiece surface is engaged thereby. Such movement of the electrode tip between the retracted and unretracted positions is advantageously accommodated by the yieldable features of the seal 868.

In addition to providing the preferred electrical contact between the workpiece and the electrode tip, the finger assembly also forms a mechanical contact or connection between the assembly and the workpiece which effectively fixes the workpiece relative to the workpiece holder. Such is advantageous because one aspect of the preferred processing method includes rotating the workpiece about rotor axis 822 while the workpiece is exposed to the preferred plating material. Such not only ensures that the electrical connection and hence the electrical bias relative to the workpiece is maintained during processing, but that the mechanical fixation of the workpiece on the workpiece holder is maintained as well.

The above described pneumatically effectuated movement of the preferred finger assemblies between the engaged and disengaged positions is but one manner of effectuating such movement. Other manners of effectuating such movement are possible.

The invention also includes novel methods for presenting a workpiece to a semiconductor process. In such methods, a workpiece is first secured to a workpiece holder. The methods work equally well for workpiece holders known in the art and for the novel workpiece holders disclosed herein.

In the next step in the sequence, the workpiece holder is rotated about a horizontal axis from an initial or first position where the workpiece holder was provided with the workpiece to a second position. The second position will be at an angle to the horizontal. The angle of the workpiece holder to the horizontal is defined by the angle between the plane of the workpiece and the horizontal. In the method, the workpiece holder is advantageously suspended about a second horizontal axis which is parallel to the first horizontal axis of the workpiece holder. At this point in the method, the angle between the first and second horizontal axes and a horizontal plane corresponds to the angle between the workpiece holder and the horizontal. The workpiece holder is then pivoted about the second horizontal axis to move the workpiece and the workpiece holder from its initial location to a final location in a horizontal plane. Advantageously, when the workpiece holder is pivoted about the second horizontal axis, the first horizontal axis also pivots about the second horizontal axis.

Preferably, during the step of rotating the workpiece holder about the first horizontal axis, the angle of the workpiece holder with respect to some known point, which is fixed with respect to the workpiece holder during the rotation process, is continually monitored. Monitoring allows for precise positioning of the workpiece holder with respect to the horizontal surface.

Likewise, during pivoting of the workpiece holder about the second horizontal axis, it is preferable that the angle defined by the line connecting the first and second horizontal axes and the horizontal plane be continually monitored. In this manner, the absolute position of the workpiece holder (and hence the workpiece itself) will be known with respect to the horizontal plane. This is important since the horizontal plane typically will contain the process to which the workpiece will be exposed.

It should be noted that in the above and following description, while the workpiece is described as being presented to a horizontal plane, it is possible that the workpiece may also be presented to a vertical plane or a plane at any angle between the vertical and the horizontal. Typically, the processing plane will be a horizontal plane due to the desire to avoid gravitational effects on process fluids to which the workpiece is exposed. In one embodiment after the workpiece has been presented to the processing plane, the workpiece holder is rotated about a spin axis to cause the workpiece to spin in the horizontal plane. Although not required in all semiconductor manufacturing processes, this is a common step which may be added in the appropriate circumstance.

The next advantageous step in the method consists of pivoting the workpiece holder about the second horizontal axis back along the path that the workpiece holder was initially pivoted along when presenting the workpiece to the horizontal process plane. There is no requirement that the workpiece holder be pivoted back to the same position whence it began, although doing so may have certain advantages as more fully described below.

The method advantageously further consists of the step of rotating the workpiece holder about the first horizontal axis to return the workpiece to the position when it was initially presented to and engaged by the workpiece holder. It is advantageous to rotate the workpiece holder about the first axis in a direction opposite from the initial rotation of the workpiece holder.

The advantage of having the workpiece holder terminate at an end position which corresponds to the initial position when the workpiece was loaded into the workpiece holder is efficiency. That is, additional machine movements are not required to position the workpiece holder to receive a new workpiece.

The method more preferably includes the step of rotating the workpiece holder about the first horizontal axis at at least two support points along the first horizontal axis. This beneficially provides support and stability to the workpiece holder during the rotation process and subsequent movement of the apparatus.

The method also more preferably includes the step of pivoting the workpiece holder along with the first horizontal axis about the second horizontal axis at at least two support points along the second horizontal axis. This beneficially provides additional support for the workpiece holder while allowing the workpiece holder to be moved in a vertical or "Z-axis" direction.

Importantly, the only motion described in the above method is rotational motion about several axes. In the method described, there is no translational motion of the workpiece holder in a X-, Y-, or Z-axis without corresponding movement in another axis as a result of rotating through an arc.

In compliance with the statute, the invention has been described in language more or less specific as to structural and methodical features It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A workpiece processing method comprising:
    positioning an electrode against a workpiece surface, said electrode having an electrode tip having a sheath, said sheath having a sheath tip rim;
    engaging said workpiece surface with said sheath tip rim to thereby cause the sheath tip rim to splay outwardly upon said contacting to form a continuous seal about the periphery of said electrode tip;
    with said electrode tip electrically engaging said workpiece, imparting a desired electrical bias to said workpiece; and
    electrochemically processing the workpiece.

2. The workpiece processing method of claim 1 further comprising supporting said workpiece in a position adjacent said sheathed electrode.

3. The workpiece processing method of claim 1 wherein said positioning step comprises:
    moving said electrode along a first motion axle away from a disengaged position; and
    moving said electrode along a second motion axis that is different from said first motion axis toward an engaged position.

4. The workpiece processing method of claim 1 wherein said positioning step comprises:
    longitudinally moving said electrode along a longitudinal movement axis away from a disengaged position in which said workpiece surface is not engaged by said electrode tip; and
    rotating said electrode about said longitudinal movement axis toward an engaged position in which said electrode tip is placed in electrical contact with said workpiece surface.

5. The workpiece processing method of claim 1 wherein said positioning step comprises:

moving said electrode along a first motion axis away from a disengaged position;

moving said electrode along a second motion axis toward an engaged position, said second motion axis being different from said first motion axis;

said engaging step comprising advancing said electrode tip from a retracted position within the sheath to an unretracted position in which said workpiece surface is physically engaged by the electrode tip.

6. The workpiece processing method of claim 1 wherein said positioning step comprises:

longitudinally moving said sheathed electrode along a longitudinal movement axis away from a disengaged position in which said workpiece surface is not engaged by said electrode tip;

rotating said electrode about said longitudinal movement axis and toward an engaged position in which said electrode tip may engage said workpiece surface; and said engaging step comprising advancing said electrode tip from a retracted position within the sheath to an unretracted position in which said workpiece surface is physically engaged by the electrode tip.

7. A process for electroplating a metal onto the surface of a workpiece comprising:

placing the workpiece upon a processing head including an electrode contact assembly, the electrode contact assembly comprising at least one electrode contact having a contact tip and at least one sealing member disposed proximate the contact tip of the at least one electrode contact, the at least one sealing member including a resilient rim;

driving the electrode contact assembly into engagement with the workpiece to place the at least one electrode contact into electrical engagement with the workpiece, the at least one sealing rim splaying away from the contact tip of the at least one electrode contact to thereby form a continuous seal against a surface of the workpiece;

placing the workpiece into contact with an electrolyte;

providing electrical power to the at least one contact and an anode disposed in electrical contact with the electrolyte to thereby electroplate the metal on the workpiece.

8. A process for electroplating a metal onto the surface of a workpiece comprising:

placing the workpiece upon a processing head including an electrode contact assembly, the electrode contact assembly comprising a plurality of electrode contacts each having a contact tip and a plurality of sealing members respectively associated with an proximate each of the contact tips, each of the plurality of sealing members including a respective resilient rim;

driving the electrode contact assembly into engagement with the workpiece to place the plurality of electrode contacts into electrical engagement with the workpiece, the sealing rims splaying radially outward from each respective contact tip to thereby form a continuous seal against a surface of the workpiece around the respective contact tip;

placing the workpiece into contact with an electrolyte;

providing electrical power to the plurality of electrode contacts and an anode disposed in electrical contact with the electrolyte to thereby electroplate the metal on the workpiece.

9. A workpiece processing method comprising:

positioning an electrode against a workpiece surface, said electrode having an electrode tip having a sheath, said sheath having a sheath tip rim;

engaging said workpiece surface with said sheath tip rim to thereby cause the sheath tip rim to splay outwardly upon said contacting to form a continuous seal about the periphery of said electrode tip;

with said electrode tip electrically engaging said workpiece, imparting a desired electrical bias to said workpiece; and exposing the electrically biased workpiece to en electrolyte, the continuous seal separating a contact of the electrode from the electrolyte.

* * * * *

UNITED STATES PATENT AND TRADEMARK OFFICE
CERTIFICATE OF CORRECTION

PATENT NO. : 6,733,649 B2
DATED : May 11, 2004
INVENTOR(S) : Martin Bleck et al.

It is certified that error appears in the above-identified patent and that said Letters Patent is hereby corrected as shown below:

Column 11,
Line 19, "filly" should be -- fully --;

Column 13,
Line 2, "a" should be -- as --;

Column 15,
Line 60, "stints" should be -- struts --;

Column 17,
Line 43, "fling" should be -- fixing --;
Line 49, delete "so" between "contacting" and "a";

Column 22,
Line 51, "axle" should be -- axis --;

Column 24,
Line 39, "en" should be -- an --;

Signed and Sealed this

Twenty-third Day of November, 2004

JON W. DUDAS
*Director of the United States Patent and Trademark Office*